United States Patent

Yano et al.

[11] Patent Number: 5,872,716
[45] Date of Patent: Feb. 16, 1999

[54] SEMICONDUCTOR INTEGRATED LOGIC CIRCUIT DEVICE USING A PASS TRANSISTOR

[75] Inventors: Kazuo Yano, Hino; Yasuhiko Sasaki, Kokubunji, both of Japan

[73] Assignee: Hitachi, Ltd., Tokyo, Japan

[21] Appl. No.: 703,189

[22] Filed: Aug. 26, 1996

Related U.S. Application Data

[62] Division of Ser. No. 333,972, Nov. 3, 1994, Pat. No. 5,581,202.

[30] Foreign Application Priority Data

Nov. 8, 1993 [JP] Japan .................................. 5-278055

[51] Int. Cl.⁶ .................................................. G06F 13/00
[52] U.S. Cl. .......................... 364/489; 364/488; 326/101
[58] Field of Search ..................... 364/488–491, 364/578; 326/39, 41, 44, 47, 49, 101, 102, 103

[56] References Cited

U.S. PATENT DOCUMENTS

| | | | |
|---|---|---|---|
| 4,642,487 | 2/1987 | Carter | 326/44 |
| 4,745,084 | 5/1988 | Rowson et al. | 326/41 |
| 4,870,302 | 9/1989 | Freeman | 326/40 |
| 4,967,107 | 10/1990 | Kaplinsky | 326/44 |
| 5,038,192 | 8/1991 | Bonneau et al. | 326/41 |
| 5,122,685 | 6/1992 | Chan et al. | 326/47 |
| 5,132,571 | 7/1992 | McCollum et al. | 326/101 |
| 5,378,094 | 1/1995 | Suzuki et al. | 326/41 |
| 5,581,202 | 12/1996 | Yano et al. | 326/101 |

FOREIGN PATENT DOCUMENTS

| | | |
|---|---|---|
| 1-29611 | 5/1989 | Japan . |
| 1-21622 | 8/1989 | Japan . |
| 1-256219 | 10/1989 | Japan . |

OTHER PUBLICATIONS

Pasternak et al., "Differential Pass–Transistor Logic", *IEEE Circuits and Devices*, Jul. 1993, pp. 23–28.

Yano et al., "A 3.8–ns CMOS 16×16–b Multiplier Using Complementary Pass–Transistor Logic", *IEEE Journal of Solid State Circuits*, V.23, No. 2, Apr. 1190, pp. 388–395.

(List continued on next page.)

*Primary Examiner*—Kevin J. Teska
*Assistant Examiner*—Vuthe Siek
*Attorney, Agent, or Firm*—Fay, Sharpe, Beall, Fagan, Minnich & McKee

[57] ABSTRACT

The semiconductor integrated circuit enjoys a high performance and can be produced at a low production cost and within a short time. A cell has an internal circuit connection such that an output terminal is connected to a plurality of input terminals through source-drain paths of active devices connected in the tree form, and gate electrodes of the active devices are connected to other input terminals. Two such cells having the same internal circuit connection, the same disposition of the internal circuit devices and the same disposition of the input/output terminals are disposed on the same chip, and mutually different logics can be accomplished by changing the form of application of input signals from outside the cells to the input terminals. A chip area of an integrated circuit designed by CAD using a cell library can be reduced and a high speed circuit operation can be attained. The present invention provides remarkable effect for improving performance of an ASIC, a microprocessor, etc., and for reducing the cost of production.

9 Claims, 23 Drawing Sheets

OTHER PUBLICATIONS

Kado, et al., "Speed Performance of Pass Transitor Logic Gate Uins CMOS/SIMOX Process", *The Institute of Electronics Information and Communication Engineers of Japan*, Spring 1992, pp. 5–181.

Universal Logic Gate Transmission Gate Array, C. Zhang, Electronic Engineering, Oct. 1985, pp. 61–67.

Yano et al., "A 3.8–ns CMOS 16×16–b Multiplier Using Complementary Pass–Transistor Logic,"IEEE, pp. 388–395, Apr. 1990.

Pasternak et al. "Different Pass–Transistor Logic, " IEEE, pp. 23–28, Jul. 1993.

Suzuki et al. "A 1.5–ns 32–b CMOS ALU in Double Pass–Transistor Logic," IEEE, pp. 1145–1151, Nov. 1993.

Pasternak et al. "GaAs MESFET Differential Pass–Transistor Logic," IEEE, pp. 1309–1316, Sep. 1991.

Hu et al "Application of Multiple–Valued Switch–Level Algebra to the Design and Analysis of Pass–Transistor Switch Networks," IEEE, pp. 196–201, May 1990.

Ghosh et al "A 400MHZ Wave–Pipelined 8×8–Bit Multiplier in CMOS Technology," IEEE, pp. 198–201, Oct. 1993.

Yano et al "Lean Integration: Acheving a Quantum Leap in Performance E and Cost of Logic LSIs," IEEE, pp. 603–606, 1994.

Yano et al "Multi–Level Pass–Transistor Logic for Low––Power ULSIs" IEEE, pp. 14–15, Oct. 1995.

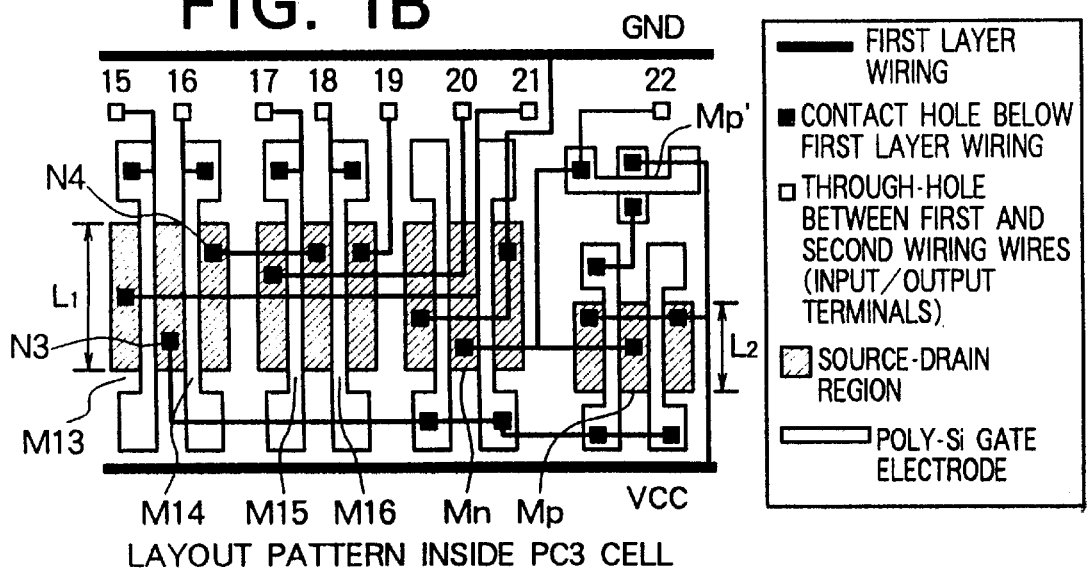

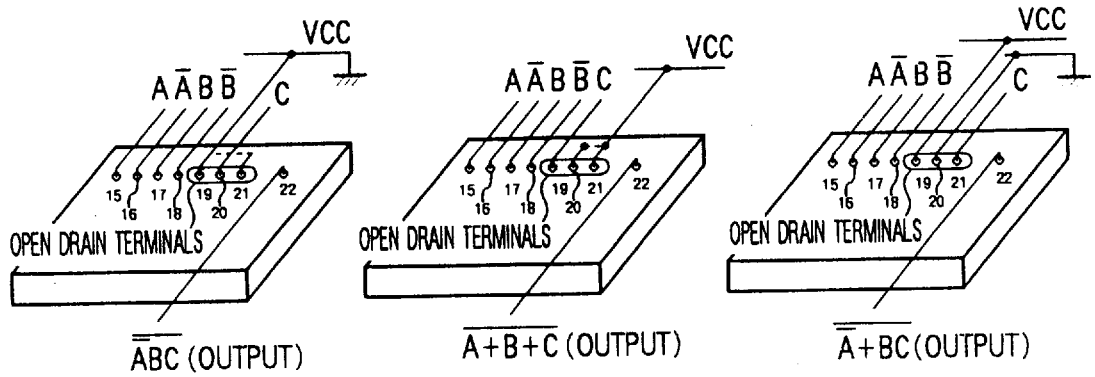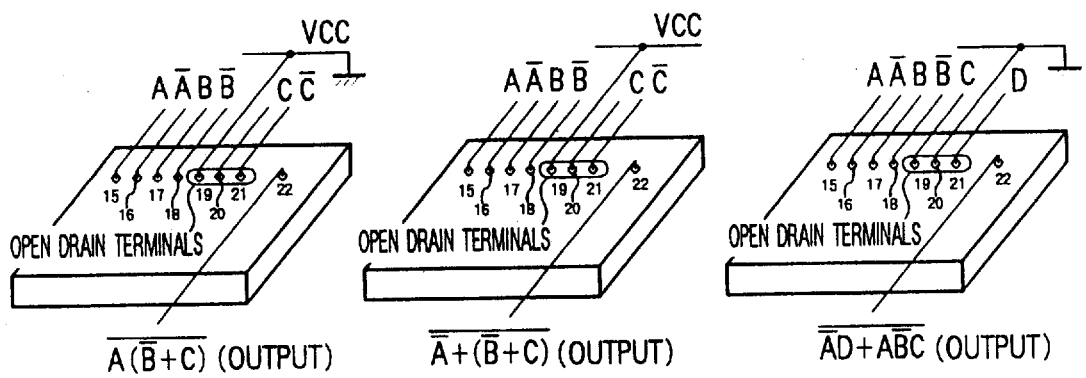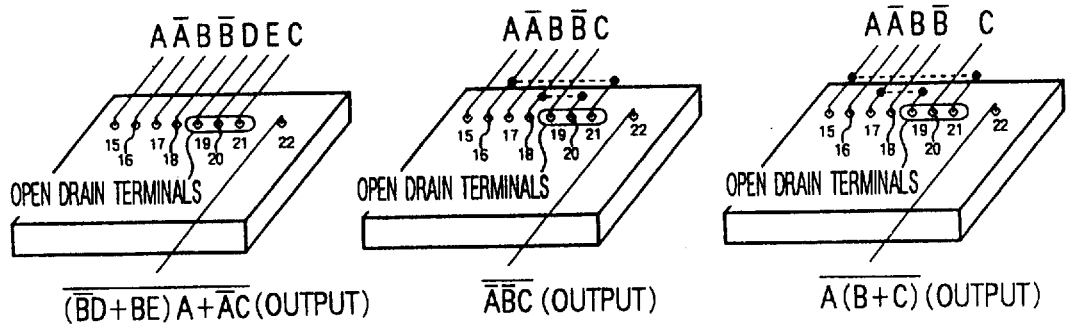

FIG. 5A

| CELL NAME | AN2 | OR2 | AN3 | OR3 |
|---|---|---|---|---|
| CELL SIZE TERMINAL POSITION | 15μm × 30μm | 15μm × 30μm | 15μm × 45μm | 15μm × 45μm |
| LOGIC FUNCTION | (3)=(1)(2) | (6)=(4)+(5) | (10)=(7)(8)(9) | (14)=(11)+(12)+(13) |
| CELL INSIDE CIRCUIT | | | | |
| DELAY TIME $t = t_0 + kC$ — $t_0$ | ...ps | ...ps | ...ps | ...ps |
| — $k$ | ...ps/F | ...ps/F | ...ps/F | ...ps/F |

$t_0$ : NON-LOAD DELAY TIME , $k$ : EQUIVALENT OUTPUT RESISTANCE

FIG. 5B

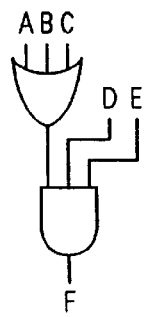

EXAMPLE OF LOGIC

FIG. 5C

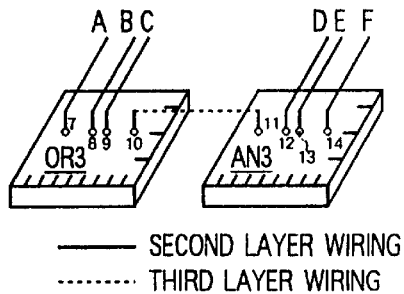

——— SECOND LAYER WIRING
·········· THIRD LAYER WIRING

EXAMPLE OF CELL ARRANGEMENT AND WIRING
TO ACCOMPLISH LOGIC OF FIG. 5B

MEANING OF SYMBOLS

STRUCTURAL EXAMPLE OF TREE LOGIC PORTION

— FIRST LAYER METAL WIRING
····· SECOND LAYER METAL WIRING

FIG. 20A
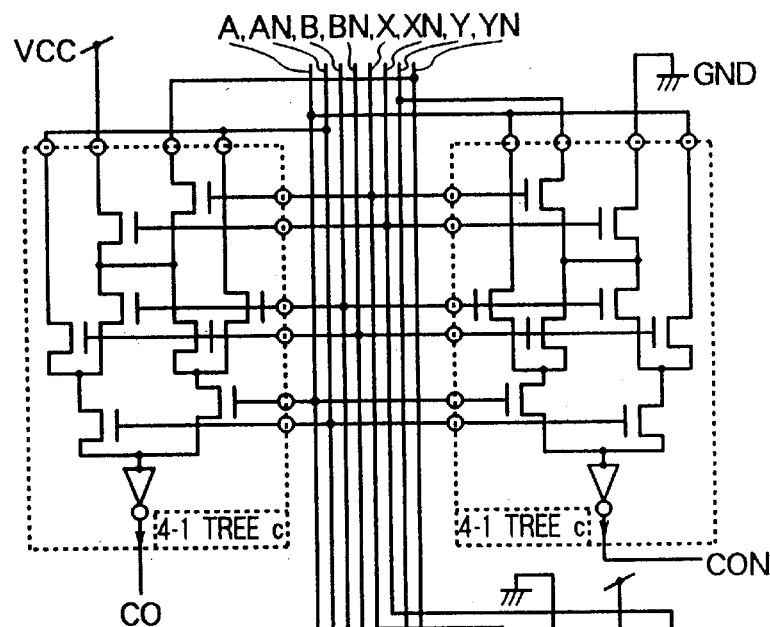
FIG. 20C
A,B : AUGEND
X,Y : MULTIPLICAND OF MULTIPLIER
C : CARRY INPUT
CO : CARRY OUTPUT
S : SUM OUTPUT
VARIABLE ENDING WITH N : INVERSION SIGNAL OF SIGNAL WITHOUT N
FIG. 20B
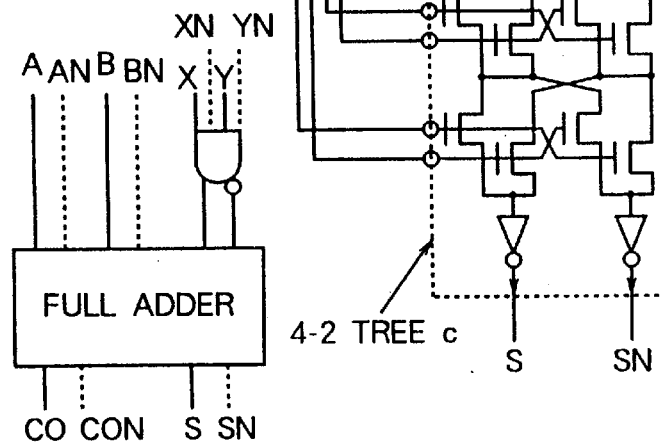
LOGIC FUNCTION OF FULL ADDER WITH
PARTIAL PRODUCT GENERATION PORTION

SEMICONDUCTOR INTEGRATED LOGIC CIRCUIT DEVICE USING A PASS TRANSISTOR

This is application is a divisional application of U.S. Ser. No. 08/333,972, filed Nov. 3, 1994 now U.S. Pat. No. 5,581,202.

BACKGROUND OF THE INVENTION

This invention relates to a semiconductor integrated circuit device and a method of producing the same. More particularly, the present invention relates to integrated circuit devices such as an application specific I.C. (ASIC), a microprocessor, a microcontroller, a digital signal processor, etc., and a method of efficiently producing them.

Systems such as gate arrays, standard cells, cell based ICs, etc., have been widely employed in the past to accomplish a large-scale logic circuit, in particular. A characteristic feature of these integrated circuits is that partial circuits referred to as "cells" are prepared in advance.

The term "cell" means a small scale logic circuit such as NAND, NOR, etc., for which layout of a mask pattern has already been finished. Generally, the positions of input/output terminals and an operation speed are determined besides the mask layout.

When information on this cell is gathered and registered to an auxiliary memory unit of a computer for computer aided design, it is referred to as a "cell library" (or sometimes "macrocell library", "macro library", "device library" and "standard cell library").

If such a cell library for so-called "CAD (Computer Aided Design)" is prepaid in advance, an integrated circuit having an intended logic function can be accomplished by merely disposing the cells on a chip and connecting the terminals of the cells by wirings. Accordingly, the integrated circuit having the intended logic function can be fabricated within a short time because logic design can be carried out without taking a circuit operation on a transistor level and layout into consideration.

A "pass transistor circuit" is another technology associated with the present invention. It is known that when the pass transistor circuits are used, logic such as 2-input AND, OR, exclusive-OR (XOR), etc., can be accomplished in a smaller area and at a higher speed than ordinary CMOS circuits by using the same internal circuit connection and changing the application forms of external 2-input signals and their inverted 2-input signals (that is, two complementary input signals).

A publication, J. H. Pasternak et al IEEE Circuits and Devices, July, 1993, pp. 23–28 and a publication K. Yano et al IEEE Journal of Solid-State Circuits, Vol. 25, No. 2, pp. 388–395 (1990) can be cited as the references relating to this pass transistor circuit.

These references describe that in order to constitute 3-input OR, AND, XOR, etc., by using the means of this pass transistor circuit, the internal circuit connection for constituting XOR is different from the internal connection for constituting OR and AND, and that the application form of the 3-input signal for constituting XOR is different from the application form of the 3-input signal for constituting OR and AND.

On the other hand, the article "Speed Performance of Pass Transistor Logic Gate Using CMOS/SIMOX Process" by Y. Kado et al, 1992 The Institute of Electronics Information and Communication Engineers of Japan, Spring Meeting, C-560, pp. 5–181 describes a 2-input NAND/AND gate circuit having improved speed performance wherein an inverter for amplifying an output voltage is connected to a source-drain path of a pass transistor, and when the drain and the gate of one pass transistor are driven by complementary input signals or by the same input signal, speed performance can be improved by setting the drain input signal to a ground level Vss or to a power supply voltage level $V_{DD}$.

SUMMARY OF THE INVENTION

When logics of a plurality of cells used in a large-scale logic integrated circuit such as a conventional gate array, a standard cell, etc., are different, the internal circuit connection becomes naturally different.

Therefore, a cell library for accomplishing a large-scale logic integrated circuit generally contains a great number of cells such as sixty or more cells. A great deal of labor are necessary to prepare such a large number of cells. For, it is necessary to determine the internal circuit connection and the positions of the input/output terminals for each of the cells, to execute mask layout and to evaluate a delay time. If the number of cells is reduced so as to reduce this labor, the necessary logics are not prepared as the cells in many cases. In such cases, two or more cells must be combined to accomplish the required logics. As a result, the area of the integrated circuit and its delay time as well as power consumption becomes great. In other words, the reduction of the number of cells registered is not a realistic solution from the aspect of performance.

It is further noteworthy that even when a large number of cells such as at least sixty cells are prepared, only a part of the logic functions practically used can be accomplished. For example, 3-input logics are 256 kinds in all and 4-input logics are as great as 65,536 kinds. Accordingly, even when a simple logic such as 3-input or 4-input is accomplished, the logic function must be practically accomplished by combining a large number of cells of the cell library. The integrated circuit accomplished by the combination of the cells is not always most suitable for the intended logic function, and is inferior to an optimum circuit in every aspects of the speed, the area and power consumption.

The J. H. Pasternak et al reference described above discloses a method of accomplishing logic function, based on standard cells, such as 3-input OR, AND and XOR, using the pass transistor circuit. The standard cell for accomplishing the 2-input and 3-input OR and AND logics accomplished by the present inventors on the basis of the information disclosed in this reference are shown in FIGS. 5A to 5C of the accompanying drawings. In other words, the circuit construction shown in FIGS. 5A to 5C are not known in the art. Since the input of this cell is the 2-input or 3-input, an inverter for signal inversion must be disposed inside the cell. Therefore, a logic circuit for accomplishing the OR or AND logic using the pass transistor can be provided by carrying out in advance layout of the mask pattern such as the source-drain region, the gate electrode, etc., of the transistor of the cell internal or inside circuit shown in FIG. 5A and then effecting the internal connection of this cell. A simple example is shown in FIGS. 5B and 5C.

However, the logic functions accomplished in a cell library shown in FIG. 5A is the same as that accomplished in the conventional standard cell library, such as AND and OR. Therefore, the cost of preparing the library is not reduced.

In addition, since the source-drain path of the pass transistor is directly coupled to the output terminal of the cell in this cell, the driving capacity of the cell output is limited by the ON resistance of the pass transistor. Particularly because the source-drain paths of the two pass transistors are connected in series between the input terminal and the output terminal in the 3-input circuit, the driving capacity of this cell output is extremely low.

Because the inverter for inverting the signal must be disposed in this cell, the cell involves the problem that the cell area is great.

In the pass transistor circuits disclosed in the K. Yano et al and Y. Kado et al reference described above, on the other hand, a plurality of complementary input signals are applied, so that the inverter for signal inversion is eliminated inside the circuit, and an inverter for amplifying an output voltage is coupled to the source-drain path of the pass transistor. However, these references do not teach or suggest the concept of using this pass transistor circuit for the cell of the cell library for CAD.

A semiconductor circuit according to an embodiment of the present invention includes a first cell (31 in FIG. 3) and a second cell (32 in FIG. 3) disposed at different positions on a semiconductor chip, wherein:

each of the first and second cells has a substantially square shape and includes first, second, third and fourth active devices (M13 to M16 in FIG. 1), a first node (N3), a second node (N4), first, second, third, fourth, fifth, sixth and seventh input terminals (15 to 21) and an output terminal (22);

in each of the first and second cells, a gate electrode of the first active device (M13) is coupled to the first input terminal (15);

a gate electrode of the second active device (M14) is coupled to the second input terminal (16);

a gate electrode of the third active device (M15) is coupled to the third input terminal (17);

a gate electrode of the fourth active device (M16) is coupled to the fourth input terminal (18);

a source-drain path of the first active device is coupled between the first node and the seventh input terminal;

a source-drain path of the second active device is coupled between the first node and the second node;

a source-drain path of the third active device is coupled between the second node and the sixth input terminal;

a source-drain path of the fourth active device is coupled between the second node and the fifth input terminal;

the second node is coupled to the output terminal;

disposition of the active devices and the input/output terminals inside the first cell is substantially the same as disposition of the active devices and the input/output terminals inside the second cell; and circuit connection of the active devices and circuit connection of the input/output terminals inside the first cell are substantially the same as circuit connection of the active devices and circuit connection of the input/output terminals inside the second cell;

in one of the first and second cells, a first input signal (A) is applied to the first input terminal from outside the cell;

a second input signal (AN) having an opposite phase to that of the first input signal is applied to the second input terminal from outside the cell;

a third input signal (B) is applied to the third input terminal from outside the cell;

a fourth input signal (BN) having an opposite phase to that of the third input signal is applied to the fourth input terminal from outside the cell; and signals ((C,D,E) N, Vcc) different from the first, second, third and fourth input signals (A, AN, B, BN) are applied to at least two input signals (19, 20) among the fifth, sixth and seventh input terminals from outside the cell.

A semiconductor integrated circuit according to another embodiment of the present invention includes a first cell (31 in FIG. 3) and a second cell (32 in FIG. 3) disposed at different positions on a semiconductor chip, and wherein:

each of the first and second cells has a substantially square shape and includes first, second, third and fourth active devices (M13, M14, M15, M16 in FIG. 1), first and second inverters, a first node (N3), a second node (N4), first, second, third, fourth and fifth input terminals (16, 18, 19, 20, 21) and an output terminal;

in each of the first and second cells, a gate electrode of the second active device is coupled to the first input terminal;

a gate electrode of the fourth active device is coupled to the second input terminal;

an input and an output of the first inverter are coupled to the first input terminal and to the gate electrode of the first active device, respectively;

an input and an output of the second inverter are coupled to the second input terminal and to the gate electrode of the third active device, respectively;

a source-drain path of the first active device is coupled between the first node and the fifth input terminal;

a source-drain path of the second active device is coupled between the first node and the second node;

a source-drain path of the third active device is coupled between the second node and the fourth input terminal;

a source-drain path of the fourth active device is coupled between the second node and the third input terminal;

the first node is coupled to the output terminal;

disposition of the active devices and the input/output terminals inside the first cell is substantially the same as disposition of the active devices and the input/output terminals inside the second cell;

circuit connection of the active devices and the input/output terminals inside the first cell is substantially the same as circuit connection of the active devices and circuit connection of the active devices and the input/output terminals inside the second cell;

in one of the first and second cells, a first input signal (AN) is applied to the first input terminal from outside the cell;

a second input signal (BN) is applied to the second input terminal from outside the cell; and signals ((C,D,E) N, Vcc) different from the first and second input signals (AN, BN) are applied to at least two input terminals (19, 20) among the third, fourth and fifth input terminals from outside the cell.

A semiconductor integrated circuit according to a concrete embodiment of the present invention is constituted in such a manner that the first and second cells described above can change the logical output obtained from the output terminal by changing the signal application forms to the first, second, third, fourth, fifth, sixth and seventh input terminals.

A semiconductor integrated circuit according to another concrete embodiment of the present invention has an output amplification circuit (I5 in FIG. 1), a first operation potential supply line to which a first operation voltage (Vcc) is supplied and a second operation supply line to which a second operation potential (GND) is supplied, inside the first and the second cells described above, and wherein an operation potential is supplied to the output amplification circuit when it is coupled to the first and second operation potential supply lines, an input and an output of the output amplification circuit are coupled to the first node and to the output terminal, respectively, the output amplification circuit is disposed at substantially the same position inside each of the cells and the output amplification circuit has substantially the same circuit connection by wirings in each of the cells.

A semiconductor integrated circuit according to still another concrete embodiment of the present invention includes a first layer wiring, a second layer wiring and a third layer wiring, and wherein the first layer wiring couples the active devices and the input/output terminals in each of the first and second cells, and the second layer wiring or the third layer wiring supplies the first, second, third and fourth input signals to the first, second, third and fourth input terminals, respectively, and couples the first cell to the second cell.

A semiconductor integrated circuit according to still another concrete embodiment of the present invention has the structure wherein among the fifth, sixth and seventh input terminals of one of the cells to which the different signals are applied, at least one of these input terminals is coupled to the first operation potential supply line or the second operation potential supply line.

A semiconductor integrated circuit according to still another concrete embodiment of the present invention has the structure wherein the first operation potential supply line and the second operation potential supply line are disposed substantially in parallel with each other, and the first, second, third and fourth active devices and the output amplification circuit are disposed between the first operation potential supply line and the second operation potential supply line.

In a semiconductor integrated circuit according to still another concrete embodiment of the present invention, the longitudinal direction of the gate electrodes of the first, second, third and fourth active devices and the gate electrodes of the two active devices constituting the output amplification circuit are disposed in a direction crossing substantially orthogonally the longitudinal direction of the first and second potential supply lines.

In a semiconductor integrated circuit according to still another concrete embodiment of the present invention, each of the two active devices constituting the output amplification circuit comprises a plurality of active devices having the gate electrodes thereof connected in common and the source-drain paths thereof connected in parallel.

A method of producing a semiconductor integrated circuit including the cell according to an embodiment of the present invention described above comprises:

a first step of registering in advance the positions of the input terminals of the cell, the position of the output terminal and disposition of the active devices to memory means of a computer;

a second step of reading out the positions of the input terminals, the position of the output terminal and disposition of the active devices registered at the first step from the memory means, and designating the application form of external signals to the input terminals so read out; and a third step of transferring a layout pattern to a semiconductor substrate in accordance with the signal application form designated at the second step (refer to FIG. 24).

In a production method of a semiconductor integrated circuit device according to a more concrete embodiment of the present invention, the second step described above is a step which decides a logic function of the cell by designating the signal application form to the input terminals.

In a production method of a semiconductor integrated circuit device according to a more concrete embodiment of the present invention, the first step is a step which executes registration for at least two cells, the second step is a step which reads out information of at least two cells from the memory means and designates the signal application form of external signals to the input terminals so read out, and the method further includes a step of designating the positions of a plurality of cells on a chip and wirings between the input terminals and between the cells on the basis of the signal application form designated by the second step.

The semiconductor integrated circuit according to one embodiment of the present invention can accomplish various intended logics by merely changing the application forms of a plurality of input signals to the first input terminal (15), the second input terminal (16), the third input terminal (17), the fourth input terminal (18), the fifth input terminal (19), the sixth input terminal (20) and the seventh input terminal (21) outside each cell, even when the first cell (31 in FIG. 3) and the second cell (32 in FIG. 3) have substantially the same internal circuit connection and substantially the same disposition of the internal circuit devices. Needless to say, the higher independence of a plurality of input signals, the more complicated logics can be accomplished.

Because the input and the output of the output amplification circuit (I5) are connected to the first node (N3) and to the output terminal (22) inside the cell, respectively, the output driving capacity of the cell can be increased.

In the other cell (32 in FIG. 3), on the other hand, the first input signal (A) is applied from outside the cell to the first input terminal (15), the second input signal (AN) having the opposite phase to the first input signal (A) is applied from outside the cell to the second input terminal (16), the third input signal (B) is applied from outside the cell to the third input terminal (17) and the fourth input signal (AN) having the opposite phase to the third input signal (B) is applied from outside the cell to the fourth input terminal (18). Accordingly, the inverter for inverting the input signals is eliminated inside the cell. As a result, the cell area can be reduced.

In the semiconductor integrated circuit according to another embodiment of the present invention, the first and second inverters for inverting the input signals are disposed inside the cell. Accordingly, though the cell area increases to some extents, the complementary input signals need not be applied from outside the cell, so that the area of the wiring channel outside the cell can be reduced.

The semiconductor integrated circuit according to one embodiment of the present invention includes the first operation potential supply line (Vcc) and the second operation potential supply line (GND) for supplying the operation potentials to the output amplification circuit (I5) for improving the output driving capacity inside the cell. One of the cells (32 in FIG. 3) can accomplish the intended logic when any of the first, second, third and fourth input signals (A, AN, B, BN) is appropriately applied to the sixth input terminal (20) and the seventh input terminal (21) from outside the cell. As represented in the concrete embodiment of the present invention, however, the same intended logic can be accomplished by applying the fixed potential of either the first operation potential supply line (Vcc) or the second operation potential supply line (GND) to the sixth input terminal (20) and to the seventh input terminal (21) of one of the cells. The application of the fixed potential in this way can reduce the driving load of the application of a plurality of input signals from a prestage circuit to one of the cells, and can improve speed performance.

In the semiconductor integrated circuit according to a more concrete embodiment of the present invention, the first, second, third and fourth active devices (M13, M14, M15, M16) and the output amplification circuit (I5) of one of the cells are disposed between the first operation potential supply line (Vcc) and the second operation potential supply line (GND) that are disposed substantially in parallel with each other. Accordingly, the fixed potential of either the first operation potential supply line (Vcc) or the second operation potential supply line (GND) can be easily applied to the sixth input terminal (20) and the seventh terminal (21) of one of the cells by the wiring which crosses substantially orthogonally the first operation potential supply line (Vcc) and the second operation potential supply line (GND).

In the semiconductor integrated circuit according to a more concrete embodiment of the present invention, a special contrivance is made to the disposition of the longitudinal direction of the first operation potential line (Vcc) and the second operation potential supply line (GND) and to the disposition of the gate electrodes of the first active device (M13), the second active device (M14), the third active device (Ml5), the fourth active device (M16) and the two active devices ($M_p$, $M_N$) constituting the output amplification circuit (I5). Accordingly, the semiconductor integrated circuit can be accomplished in a smaller cell area (see FIG. 1).

In the semiconductor integrated circuit according to a more concrete embodiment of the present invention, each of the two active devices ($M_p$, $M_N$) constituting the output amplification circuit (5) comprises a plurality of active devices connected in parallel. Accordingly, the output driving capacity of this output amplification circuit (I5) can be increased irrespective of the small cell area (see FIG. 1).

A production method of a semiconductor integrated circuit according to an embodiment of the present invention (see FIG. 24) makes it possible to conduct computer aided design (CAD) of a semiconductor integrated circuit containing the cells having the advantages described above, and to practically produce the semiconductor integrated circuit by this design.

The present invention is completed in the development of a large-scale logic integrated circuit capable of accomplishing the intended logics by merely changing the forms of application of a plurality of input signals from outside the cells in accordance with the intended logics by making the same the internal circuits of the cells for accomplishing various logics in an integrated circuit designed by using the cell library for the CAD.

It is an object of the present invention to furnish cells of a large-scale logic integrated circuit of this kind with a large driving capacity and to improve speed performance.

It is another object of the present invention to provide a semiconductor integrated circuit device capable of accomplishing various intended logics by merely changing the signal application form to input terminals of cells.

It is still another object of the present invention to provide a semiconductor integrated circuit device which improves the output driving capacity of the cells described above.

It is still another object of the present invention to provide a semiconductor integrated circuit device which reduces the occupying area of the cells described above.

It is still another object of the present invention to provide a semiconductor integrated circuit device which reduces a wiring channel area outside the cells described above.

It is still another object of the present invention to provide a semiconductor integrated circuit device which reduces a driving load of input signals to the cells described above and improves speed performance.

It is a further object of the present invention to make it possible to conduct CAD design of a semiconductor integrated circuit inclusive of the cells described above, and to produce the semiconductor integrated circuit on the basis of the design.

BRIEF DESCRIPTION OF THE DRAWINGS

FIGS. 1A and 1B are views showing a cell library containing cells according to an embodiment of the present invention;

FIGS. 2A to 2I are views each showing an example of logic functions that can be accomplished by the cells according to the embodiment of the present invention;

FIGS. 5A to 5C are views each showing a cell library using a pass transistor circuit as a cell, and an example for accomplishing a simple logical function by using this cell;

9

Figure 17:
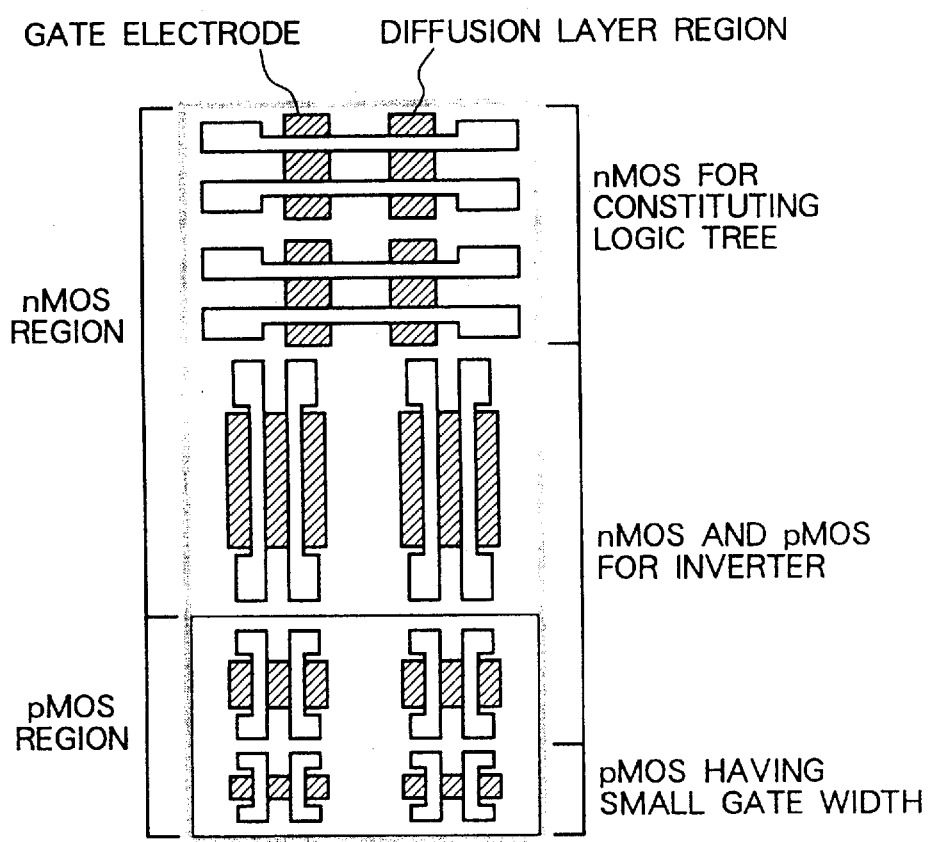
FIG. 17 is a view showing the construction of other gate array basic cell according to the embodiment of the present invention.
Figure 18A:
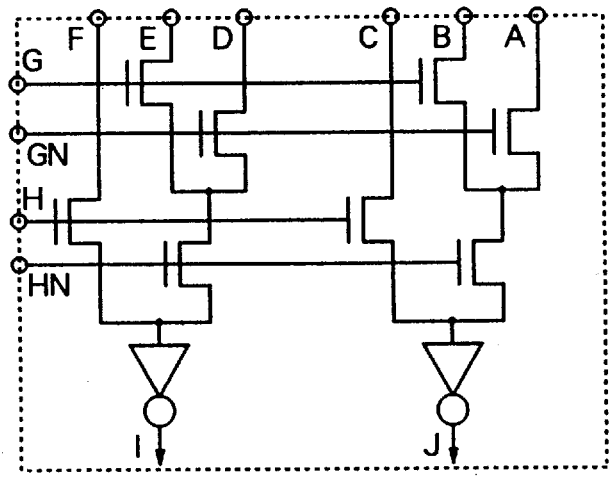
Figure 18B:
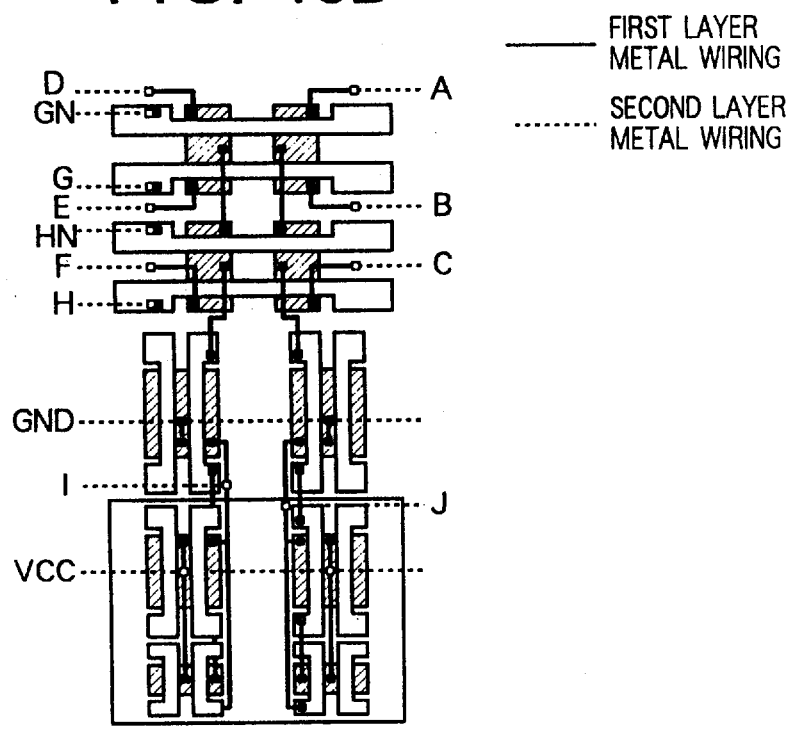
Figure 19A:
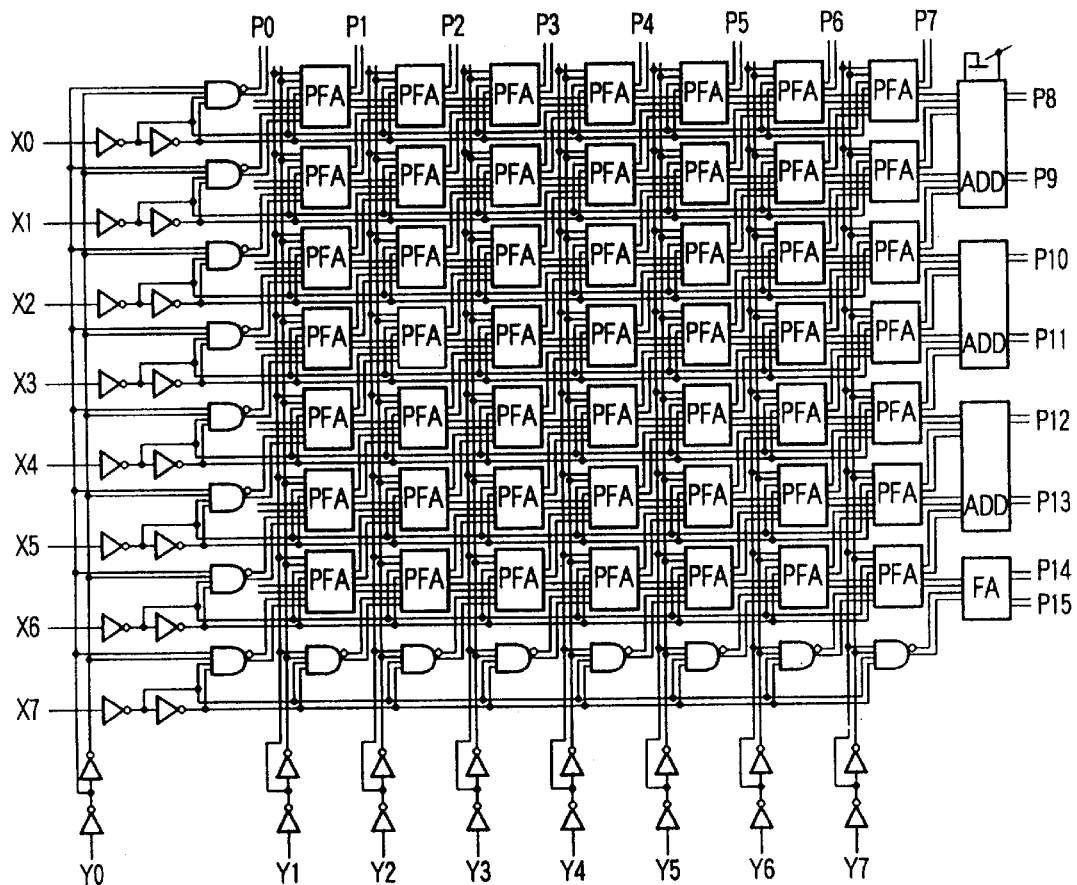
Figure 19B:
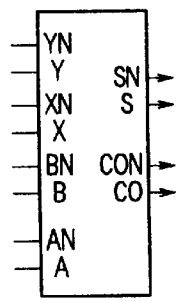
Figure 19C:
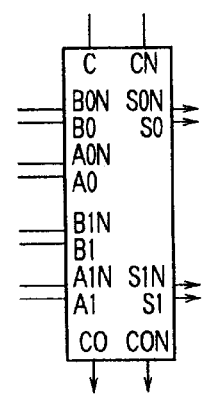
Figure 21:
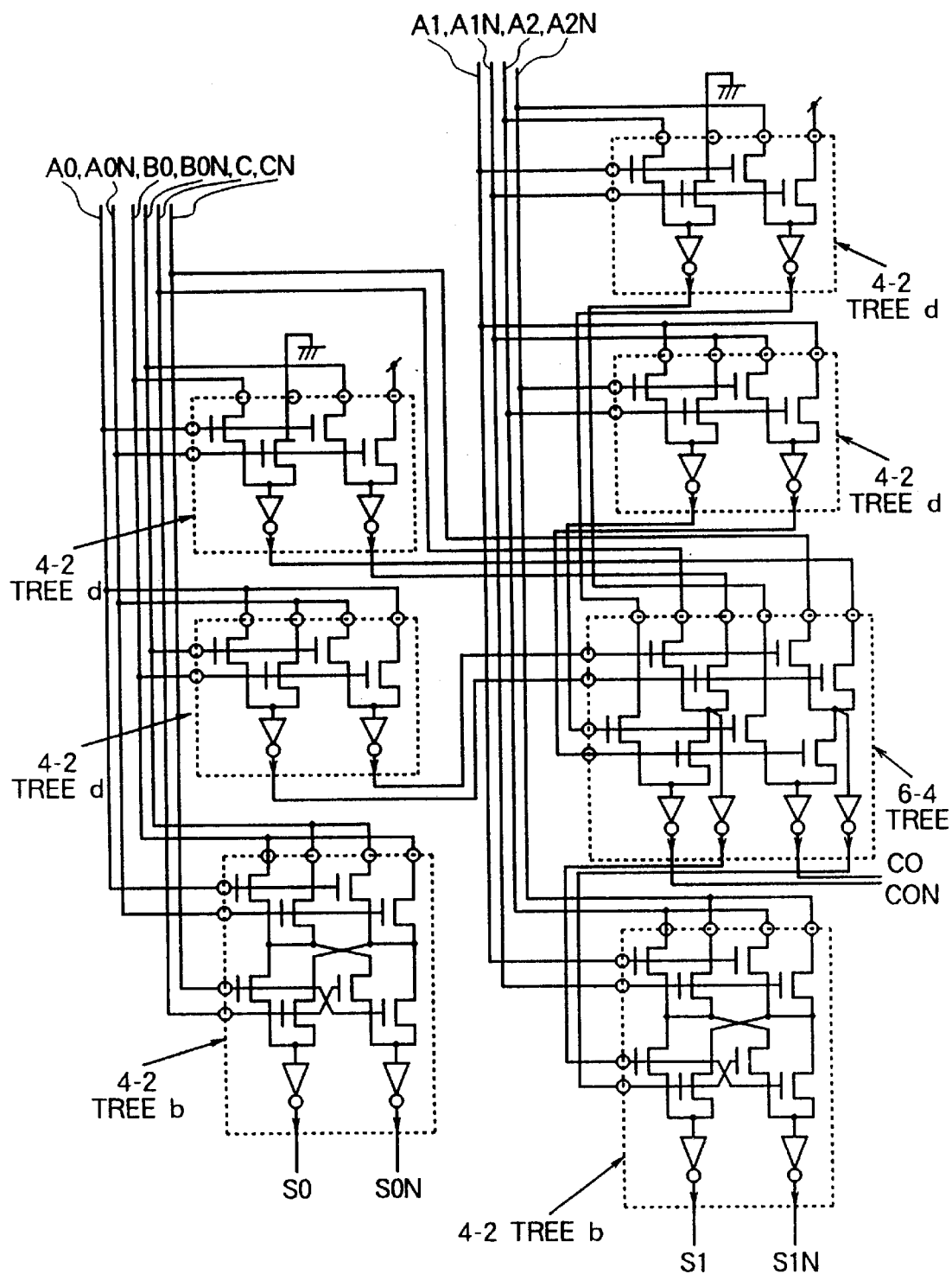
Figure 22:
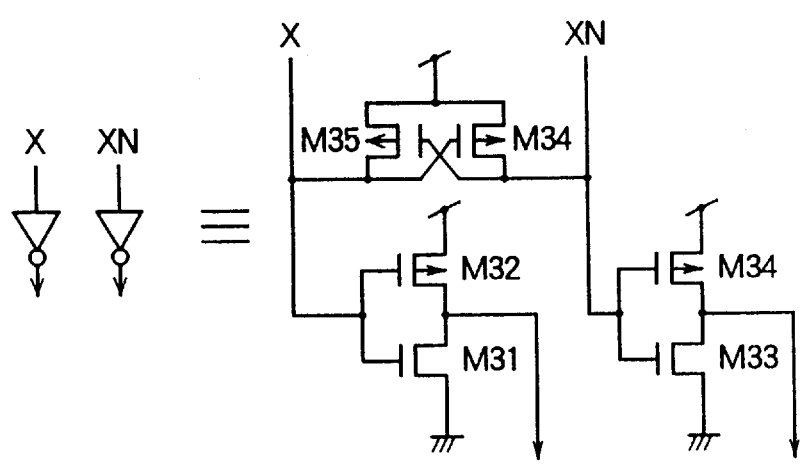
Figure 23:
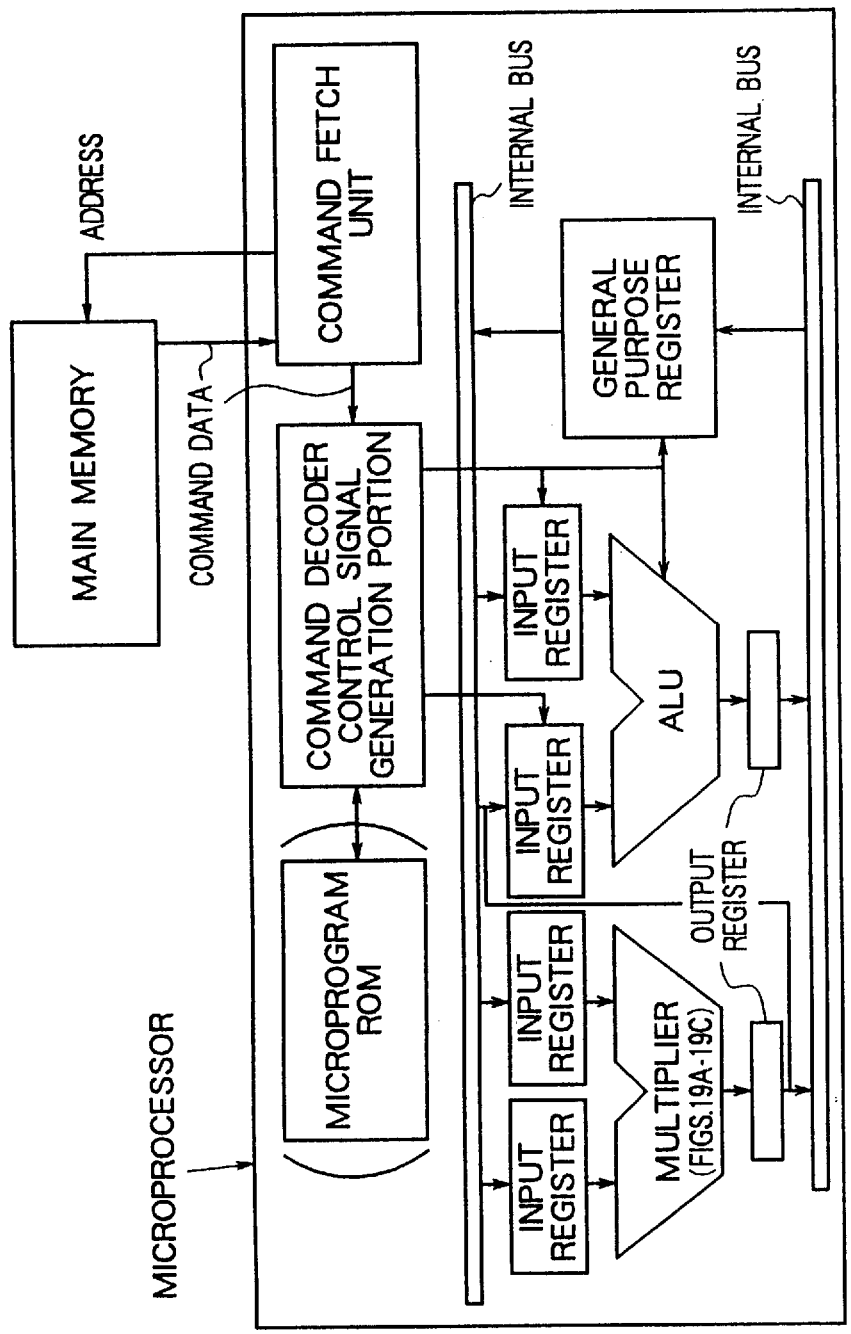
Figure 24:
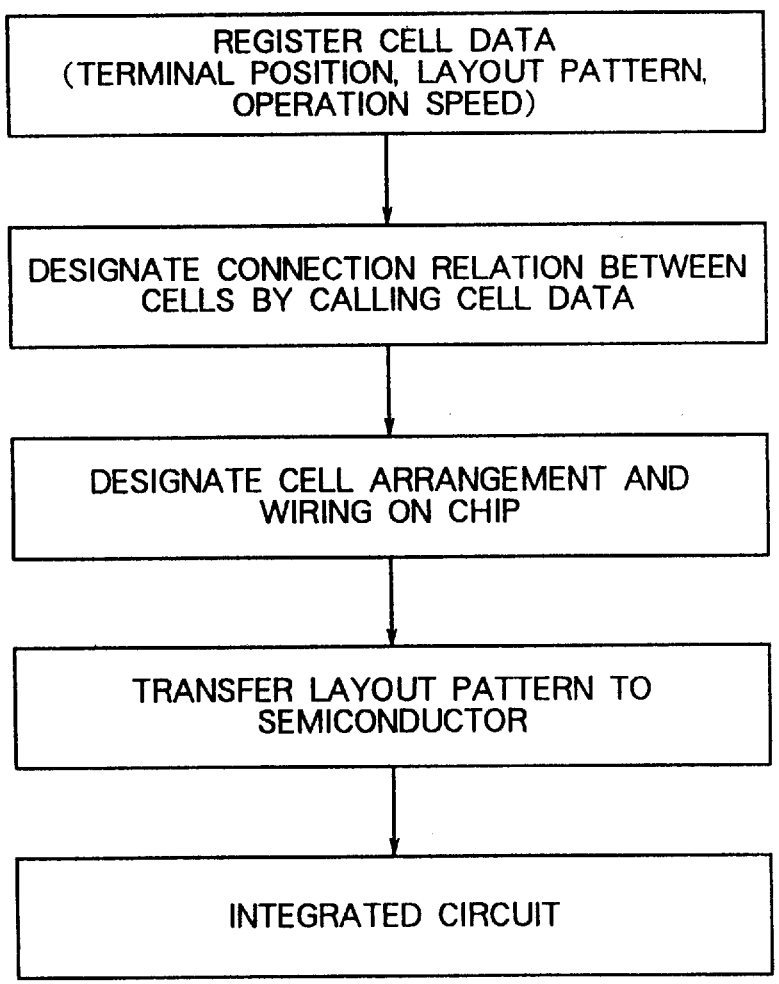

FIGS. 18A and 18B are layout diagrams when a 6-2 tree cell is constituted by using the gate array basic cell shown in FIG. 17;

FIGS. 19A to 19C are views each showing an 8×8 bit multiplier by using the cell having a tree type logic portion according to the embodiment of the present invention;

FIGS. 20A to 20C are views showing the construction of a full adder with partial product generator used for the multiplier shown in FIGS. 19A to 19C;

FIG. 21 is a view showing the construction of a 2-bit adder used for the multiplier shown in FIGS. 19A to 19C;

FIG. 22 is a view showing the construction of an output circuit which can be used when the output signals of the cell according to the embodiment of the present invention are complementary;

FIG. 23 is a view showing the construction of a data processor using the cell according to the embodiment of the present invention; and FIG. 24 is a view showing the outline of a production method of an integrated circuit using the cells according to the embodiment of the present invention.

DESCRIPTION OF THE PREFERRED EMBODIMENTS

Since the basic construction and the functions of the present invention have been described above, preferred embodiments of the invention will be now explained in detail with reference to the drawings.

FIG. 1 shows an example of two cells registered to the cell library having the basic construction of the present invention described above. The cell size, the terminal position, logic functions, the cell internal circuit and delay time characteristics of each of the two cells PC3, PC4 are illustrated at the upper part of the drawing, and the layout pattern of the internal circuit devices of the cell PC3 is shown at the lower part.

The number of the internal circuit devices of the cell PC4 is greater by 2 than that of the cell PC3 and the number of signals of the former is greater by one than that of the latter. Accordingly, the cell PC4 can accomplish more complicated logic than the cell PC3.

Inside the cell having a substantially square shape as represented by the layout pattern of the PC3 at the lower part of FIG. 1, a first operation potential supply line (Vcc) and a second operation potential supply line (GND) are disposed substantially in parallel with each other;

n-channel first, second, third and fourth MOS transistors (M13, M14, M15, M16) and a p-channel output MOS transistor (Mp) and an n-channel output MOS transistor ($M_N$) constituting an output inverter (I5) are disposed between the first operation potential supply line and the second operation potential supply line;

the output inverter (I5) is connected to the first and second operation potential supply lines and receives the supply of the operation potential;

the gate electrode of the first MOS transistor (M13) is connected to a first input terminal (15);

the gate electrode of the second MOS transistor (M14) is connected to a second input terminal (16);

the gate electrode of the third MOS transistor (Ml5) is connected to a third input terminal (17);

the gate electrode of the fourth MOS transistor (M16) is connected to a fourth input terminal (18);

10 the source-drain path of the first MOS transistor (M13) is connected between a first node (N3) and a seventh input terminal (21);

the source-drain path of the second MOS transistor (M14) is connected between the first node (N3) and the second node (N4);

the source-drain path of the third MOS transistor (Ml5) is connected between the second node (N4) and a sixth input terminal (20);

the source-drain path of the fourth MOS transistor (M16) is connected between the second node (N4) and a fifth input terminal (19); and the gate electrodes of the p-channel output MOS transistor (Mp) and the n-channel output MOS transistor (Mn) as the input of the output inverter (I5) and the drain regions of the p-channel output MOS transistor (Mp) and the n-channel output MOS transistor (Mn) as the output of the output inverter (I5) are connected to the first node (N3) and to the output terminal (22), respectively.

Incidentally, in the cell PC3 shown in FIG. 1, when the input and the output of the first inverter are connected to the second input terminal (16) and to the gate electrode of the first MOS transistor (M13), respectively, and when the input and the output of the second inverter are connected to the fourth input terminal (16) and the gate electrode of the fourth MOS transistor (M16), respectively, the first input terminal (15) and the third input terminal (18) can be omitted from the cell, the necessity for the supply of the complementary input signals from outside the cell can be eliminated and the wiring channel area outside the cell can be reduced, although the cell area somewhat increases.

Particularly, the n-channel first, second, third and fourth MOS transistors (M13, M14, M15, M16) and the channel length ($L_1$) of the n-channel output MOS transistor ($M_N$) constituting the output inverter (I5) are defined in a direction crossing substantially orthogonally the direction of the first operation potential supply line (Vcc) and the second operation potential supply line (GND). Because the p-channel MOS transistor (Mp') for reducing the steady current of the output inverter (I5) is disposed, the channel length ($L_2$) of the p-channel output MOS transistor (Mp) constituting the output inverter (I5) is somewhat smaller than the channel length ($L_1$) described above.

To increase the output driving capacity of the output inverter (I5), two gate electrodes of the p-channel output MOS transistor (Mp) and the n-channel output MOS transistor (Mn) are commonly connected, and two source-drain paths are connected in series, and this circuit construction should be carefully noted.

As described above, the cell PC3 uses the internal circuit formed by coupling the n-channel MOS transistors (M13 and M14 or M15 and M16) as a pair in a binary tree form, and mask pattern layout corresponding to this circuit construction is made in advance (lower figure of FIG. 1).

Incidentally, the cell PC3 includes four gate input terminals (15 to 18) and three open drain input terminals (19 to 21), and reference numeral 22 denotes the output terminal. These terminals are formed by using through-holes of a first layer wiring and a second layer wiring, for example (refer to the lower figure of FIG. 1).

At this time, wiring between the transistors inside the cell is primarily established by the first layer wiring (refer to "layout pattern inside cell" at the lower part of FIG. 1), and wiring between the cells is made by connecting the second layer wiring to the through-holes. Wiring in a transverse direction crossing the second layer wiring can be made by a third layer wiring (refer to "cell disposition and wiring outside cell" in FIG. 3).

The drain terminals (19, 20, 21 in FIG. 1) of the MOSFETs of this cell are open, and different logical outputs can be obtained by changing the form of application of the inputs from outside the cell. The forms of application of the inputs to these open drain terminals (19, 20, 21) are as follows (refer to FIG. 2).

In other words, the forms of application of inputs include:

(1) to connect to the power supply line (Vcc);

(2) to connect to the ground line (GND);

(3) to connect to the same signal as the signal to be applied to other input terminals (15 to 21);

(4) to connect to a complementary signal of a signal to be applied to other input terminals (15 to 21); and (5) to connect an independent signal which does not fall within the cases described above.

Incidentally, the layout pattern of the cell PC4, too, can be constituted in the same way as the layout pattern of the cell PC3.

As shown in FIG. 2, various logic outputs can be obtained by changing the forms of application of the signals applied to the open drain terminals (19 to 21). In the nine examples shown in FIG. 2, signals A, AN, B and BN are equally applied to the gate input terminals (15, 16, 17, 18) (the suffix "N" represents the complementary signal). The forms of application of the signals to the open drain terminals (19 to 21) are mutually different. In FIG. 2A, the open drain terminals 19 and 21 are connected to the ground line, and an independent signal (C), which is independent of the other input signals (15 to 19, 21), is applied to the terminal 20. At this time, if the condition (15)=A, (16)=AN, (17)=B, (18)=BN, (19)=0, (20)=C and (21)=0 is applied to the cell output formula (refer to the "logic function" in FIG. 1) given by the following formula:

$$(22)=((19)(18)+(20)(17)(16)+(21)(15))N$$

the logic output to the output terminal (22) can be obtained. In this case, $$(22)=((AN)BC)N$$

and a 3-input NAND function can be accomplished (where an A input is a negative logic).

Figure 3:
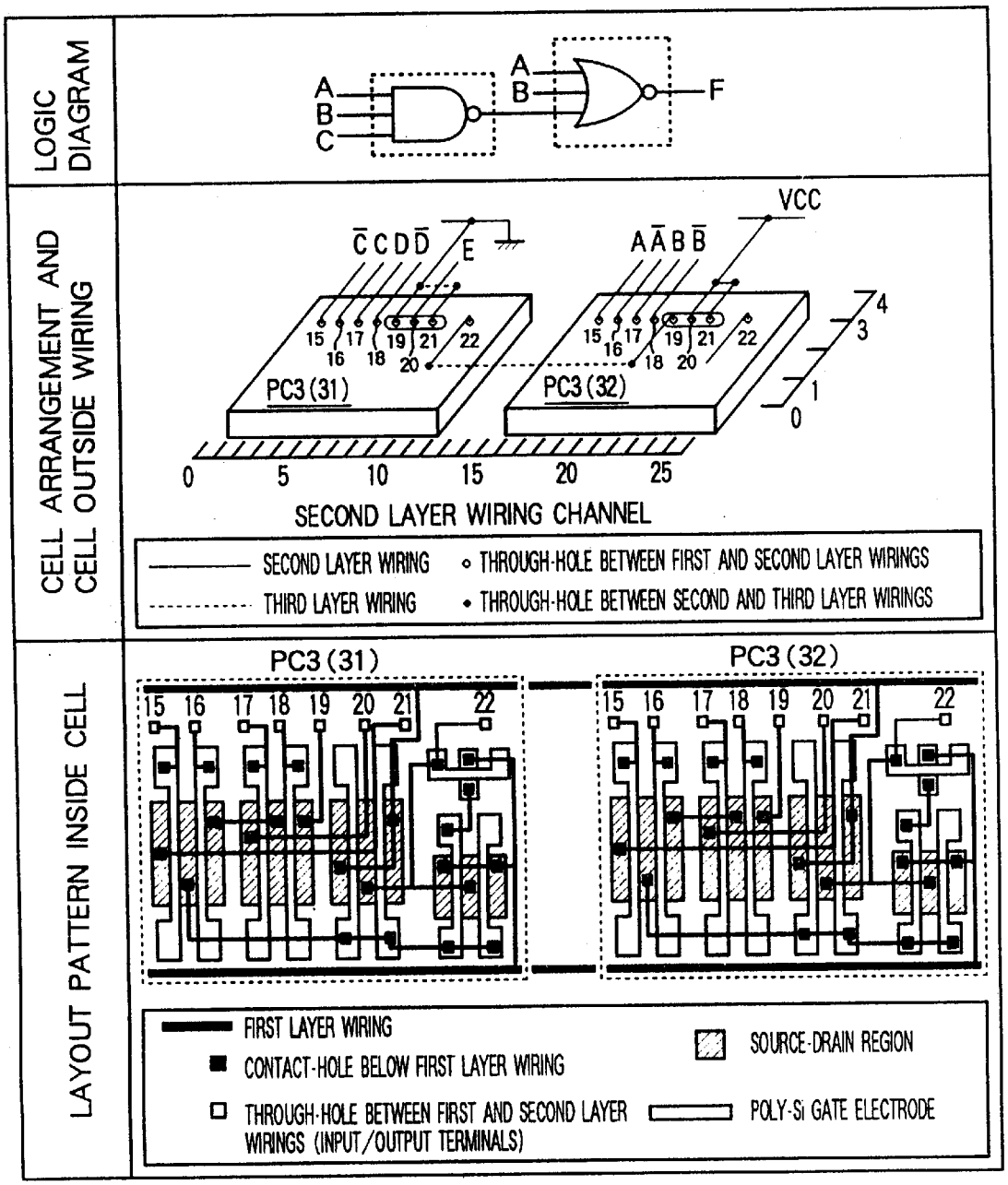
FIG. 3 is a view for accomplishing a simple logical function by using two cells according to the embodiment of the present invention.

As shown in FIG. 2B, 3-input NOR can be accomplished by connecting the open drain terminals 20, 21 to the power supply line and applying an independent signal (C), which is independent of the other input terminals, to the terminal 19. This also holds true of the other logic functions.

An example where complicated logic functions are accomplished by using two simple cells PC3 ((31), (32)) having the same internal circuit connection is shown in FIG. 3.

As shown in FIG. 3, two cells PC3 ((31), (32)) are disposed, the power supply lines (Vcc) and the ground lines (GND) of these two cells are connected in common and signal supply wirings outside the cells are made mutually different. In this manner, 3-input NAND and 3-input NOR can be accomplished. In this instance, the device arrangement inside the cells and the wirings inside the cells are naturally the same in the two cells. Accordingly, when these chips are viewed from above, the layout patterns of these two cells are the same (refer to the "layout pattern inside the cell" at the lower part of FIG. 3).

The major feature of the cell PC3 according to this embodiment resides in that not only the simple logic such as 3-input NAND but also a complicated function of calculating XOR of two inputs (BN, C) shown in FIG. 2B and then calculating NAND between this output and the third signal (A) can be accomplished by using only one cell. In this case, the open drain terminal 19 is connected to the ground line (GND), the terminal 20 is connected to the independent signal C and the terminal 21 is connected to the complementary signal of the signal C. When the same logic function is accomplished by using the conventional cell library shown in FIG. 5, at least two cells OR3 AND AN3 having different internal circuit connection and different layout patterns must be combined with each other.

Figure 4:
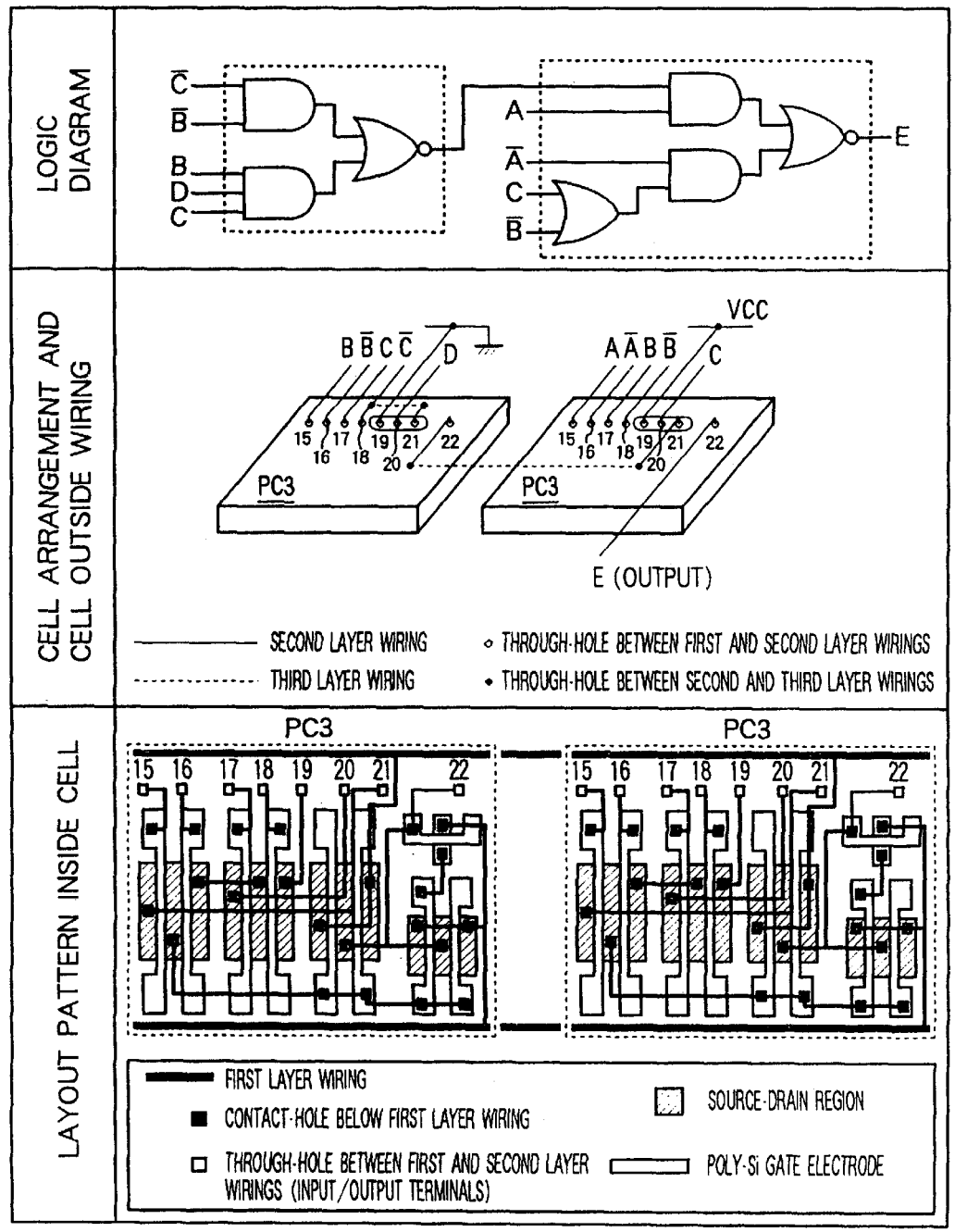
FIG. 4 is a view for accomplishing complicated logical functions by using two cells according to the embodiment of the present invention.

On the other hand, FIG. 4 shows an example where a considerably complicated logic function is accomplished by using only two cells PC3 according to this embodiment which have the same internal circuit connection and the same layout pattern. In the example shown in FIG. 4, a logic which requires seven cells in the past can be accomplished by only two cells PC3 having the same internal circuit connection and the same layout pattern. Because the embodiment can accomplish various complicated logic functions by using only one cell PC3, a logic circuit having complicated logic functions can be accomplished extremely compactly.

As described above, the practical cell library according to the prior art must prepare 60 or more cells but according to the present invention, the cell library can be accomplished by not greater than ten kinds of cells. Besides the cell PC3 (see FIG. 1) that has so far been explained, a by far greater number of functions than the conventional cell library requiring 60 or more cells can be accomplished by the cell PC4 shown in FIG. 1 and various inverter circuits in addition to PC3 (see FIG. 1) that has been explained so far. The cell PC4 shown in FIG. 1 is obtained by connecting further two MOSFETs to the terminal 21 of PC3 and can accomplish much more complicated logic functions than PC3. Accordingly, an integrated circuit having higher performance can be accomplished by using these cells PC3 and PC4 within a shorter time. Because the complicated logic functions can be compactly accomplished, large improvements can be made in all of the circuit speed, the circuit area and power consumption.

Incidentally, the PC3 cell of this embodiment shown in FIG. 1 may seem as a modification obtained by re-registering a part (the portion where M9 to M12 are connected) of 3-input OR disclosed in the Pasternak et al reference and shown in FIG. 5 as a mere cell. However, it should be noted that such a concept involves great difficulty for the following reasons.

As described above, the cell registered to the cell library of CAD is a logic circuit for which layout has already been made, and is prepared before the logic design of the entire integrated circuit. Since layout of a cell is time-consuming and troublesome, it is quite natural to constitute a cell library by selecting the cells having logic functions which have high frequency of use. Conventionally, the logic functions having high frequency of use are a 1-input inverter, 2- or 3-input AND, OR, XOR (or their negation), and it is a highlight scene for a designer of the logic how to efficiently constitute complicated logics of integrated circuit by combining them.

In contrast, when the logic output (22) of the PC3 cell according to this embodiment shown in FIG. 1 is expressed as a function of the signal of the input terminals (15 to 21) by the Boolean formula, it becomes much more complicated as shown below (see "logic function" in FIG. 1):

$(22)=(((19)(18)+(20)(17))(16)+(21)(15)))N$

Accordingly, it would be considerably difficult for those skilled in the art to dare to use those circuits which have such complicated logic functions and frequency of use of which is believed low, as the basic cell of the cell library. In other words, because it takes a great deal of time and labor to constitute the cell library, registration of the circuits hardly having high frequency of use cannot be made in the conventional logic design unless extremely high motivation exists.

The Pasternak et al reference cites AND, OR, XOR as the logic functions of the standard cell in line with this conventional, traditional concept. The Yano et al reference, too, is based on this traditional concept. Yano is one of the co-inventors of the present invention but in 1990 when this reference was published, he was aware of the fact that the AND circuit could be changed to the OR circuit by merely changing partially the signal application connection of an internal circuit of a bifurcate pass transistor circuit and therefore described this concept in the reference described above. However, because the change of connection was necessary, though partially, he was of the opinion that an AND cell and an OR cell were separately necessary, and he made no doubt about the conventional premise that logic design was made on the basis of the separate cells such as AND, OR and XOR. In this way, it was extremely customary for designers of logic circuits to make logic design using the separate cells such as AND, OR and XOR and this premise was like the premise that arithmetic calculation was made by using numerals. In other words, it has been extremely difficult for those skilled in the art to again look at this traditional concept.

In contrast, the inventors of the present invention have found out that a large number of different logic functions can be accomplished by using only one kind of the cell PC3 shown in FIG. 1 and by changing the forms of application of input signals from outside the cell. As a result, the present inventors have got rid of the conventional fixed idea that the cell function must be comprehensible on the basis of AND and OR, and have reached the concept that this bifurcate connection circuit itself should be registered as the cell and an ideal logic design must be reconstituted on the basis of such a cell.

On the other hand, a plurality of cells PC3 having different logic functions and shown in FIG. 1 have the same internal circuit connection and the same layout pattern and only the forms of application of the input signals from outside the cells are different. Accordingly, the feature that the functions of the cell PC3 shown in FIG. 1 are complicated and are not easily comprehensive would have been a critical problem several years ago. Even though the cell PC3 was prepared for the cell library, the designer of logic would not have attempted to use such an incomprehensive cell.

Recently, however, logic automatic synthesis tools (those tools which automatically output a connection net list of cells accomplishing an intended logic function when such a logic function is inputted) have been drastically put into practical application, and optimum circuit design of logic circuits (that is, decision of the connection relation of the cells) has been made by a computer but not by the designer. Under such circumstances, the present inventors have come to realize that whether or not the cell function is comprehensive to the designer has not been latently important any longer. The present inventors have completed on the basis of this concept the present invention which overthrows the basis of the logic design of the integrated circuits using AND, OR, XOR, INVERT as the basic cells that have long been employed. As a matter of fact, the present inventors have succeeded in the development of softwares which accomplish arbitrary logic functions by combining the cells shown in FIG. 1. Also, the present inventors have confirmed that when such softwares are used, the area, speed and power consumption of the integrated circuit can be drastically improved.

An amplification circuit (inverter I5) is provided to the output portion of the cell PC3 shown in FIG. 1. This amplification circuit I5, which has a large driving capacity, makes load capacity dependence of the output terminal (22) due to ON resistance of the pass transistors (M13 to M15) substantially zero, and the output signal of the cell is not transmitted to the open drain terminals (19, 20, 21) on the input side, on the contrary. In other words, once the input signal is made definite, influences are not exerted on the input signal even when the output signal changes. Accordingly, the delay time of the circuit as a whole consisting of a large number of cells can be expressed as the sum of the delay time of each cell. Accordingly, if the delay time of the cell is in advance evaluated as a function of the load capacity of the output, the overall delay time can be evaluated within an extremely short time.

When the amplification circuit of the output portion does not exist, the delay time of a particular cell cannot be determined by the input/output condition of the cell alone, but is determined by the operation of the entire circuit as an analog circuit. In other words, the delay time cannot be determined unless analysis of the entire circuit as the analog circuit is made, and a great deal of labor and time become necessary for the timing design.

The input/output terminals 15 to 21 of the cell PC3 of the embodiment shown in FIG. 1 are placed on a wiring grid. The term "wiring grid" means a grid comprising channels capable of disposing connection wirings between the cells. For example, the channels of a second layer wiring are equidistantly disposed in a longitudinal direction and channels of a third layer wiring are equidistantly disposed in a transverse direction. Through-holes between the second layer wiring and the third layer wiring are disposed at the points of intersection. Connection having high area efficiency can be made within a short time by an automatic wiring tool for the wirings limited on such a wiring grid. Connection of the cell internal circuit of PC3 shown in FIG. 1 is made by using the first layer wiring, and at this time, the wiring is disposed at an arbitrary position without taking the wiring grid into special consideration in particular. In this way, the cell area can be reduced. The input/output terminals (15 to 19) are disposed on the wiring grid as shown in FIG. 3. When the open drain terminals (19 to 21) are connected to the gate terminal of the same cell, too, they are connected along this wiring grid by using the second and third layer wirings. In this way, automatic disposition and wiring can be made, and an integrated circuit can be accomplished within a short time.

The embodiment given above represents the example where the input/output terminals of the cell are formed by one through-hole, but they can be formed by one electrode, too. Alternatively, one terminal can be formed by two or more through-holes.

Next, a high performance ASIC according to another embodiment of the present invention will be explained. This ASIC can be accomplished by using the cell library including the new cells shown in FIG. 1, attaining various logic functions shown in FIGS. 2 to 4 by using one kind of cell PC3 alone, and connecting in various ways the external wirings in the various signal application forms. In this way, an integrated circuit having high speed performance, high integration density and low power consumption can be accomplished within a short time.

A process for designing and fabricating an integrated circuit by using the cell of the present invention is shown in FIG. 24.

First, attribute data (device disposition, positions of input/output terminals, operation speed) of the cells PC3, PC4 shown in FIG. 1 and other cells are registered in advance to an auxiliary memory unit of a large-scale computer for assisting integrated circuit design (FIG. 24-(a)).

Next, the cell data registered to the auxiliary memory unit are read out and the signal application form from outside the cell is designated (FIG. 24-(b)). In this way, the connection relationship (net list) of the cell can be obtained.

The positions and wirings of a plurality of cells on the chip are then designated on the basis of this net list (FIG. 24-(c)).

The pattern is transferred to a semiconductor substrate on the basis of these layout pattern data. At this time, light, an electron beam of X-ray lithography can be used (FIG. 24-(d)). In this way, the integrated circuit can be produced.

Various circuits shown in FIG. 6 are conceivable as the amplifier (I5) of the output of the cell shown in FIG. 1.

Figure 6A:
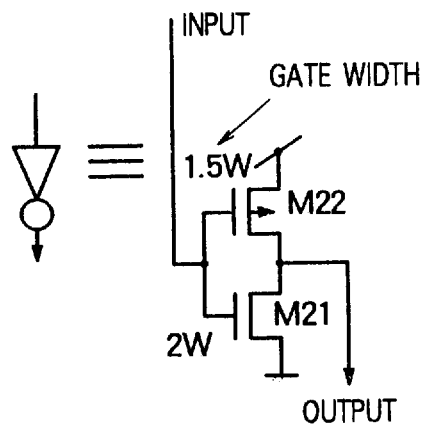
FIGS. 6A to 6C are views each showing an output inverter used for the cell according to the embodiment of the present invention.

FIG. 6A shows a simple CMOS inverter. However, whereas a gate width of a pMOS is designed to be about 1.5 to 2 times a gate width of an nMOS in an ordinary CMOS inverter, the gate width of the nMOS (M21) is set to be greater than that of the pMOS (M22) in the present invention. This is because a low level at the node N3 (see FIG. 1) can be lowered to the ground level but a high level can be raised only to Vcc-$V_T$. Here, Vcc is the power supply voltage and $V_T$ is the threshold voltage of the nMOSs (M13 to M16). Accordingly, the rise time and the fall time of the output terminal (22) can be made substantially equal to each other by setting the logical threshold value of this CMOS inverter to a low level. In a typical example, when the gate width of the nMOSs (M13 to M16, FIG. 1) constituting the logic is W, the gate width of the nMOS (M21) is set to about 2 W and the gate width of the pMOS (M22) is set to about 1.5 W.

Figure 6B:
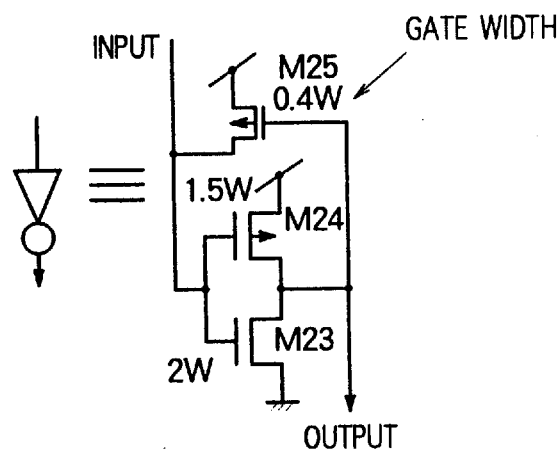

FIG. 6B shows the case where a pMOS (M25) having a small gate width is added to FIG. 6A. This pMOS charges the node N3 to the power supply voltage when the inverters M23 and M24 discharge the output, and prevents a steady current from flowing through the CMOS inverter comprising M24 and M23.

Figure 6C:
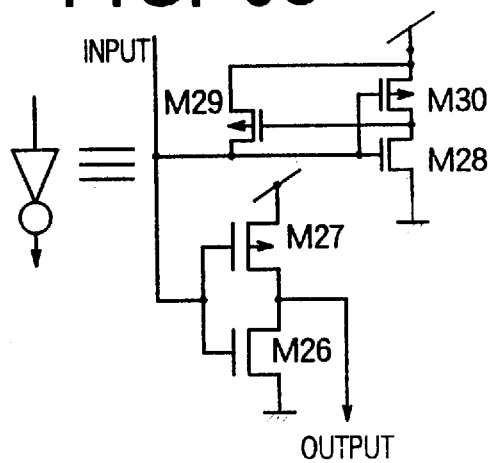

FIG. 6C shows a further improved CMOS inverter. FIG. 6C is the same as FIG. 6B in that the pMOS (M29) having a small gate width is provided to the input terminal of the amplification circuit but is different from the latter in that the gate terminal of M29 is connected to the output circuit of the inverter comprising M28 and M30. According to this circuit construction, the inverter for driving the output terminal which comprises M26 and M27 and the inverter for driving the gate terminal of M29, which comprises M28 and M30, are independently disposed. This circuit construction provides the advantage that even when a large load capacity is connected to the output terminal, feedback to the gate terminal of M29 can be made at a high speed. Since charge/discharge of the input terminal of this amplification circuit is effected within a short time, the advantage that consumed power can be reduced is obtained.

Figure 7A:
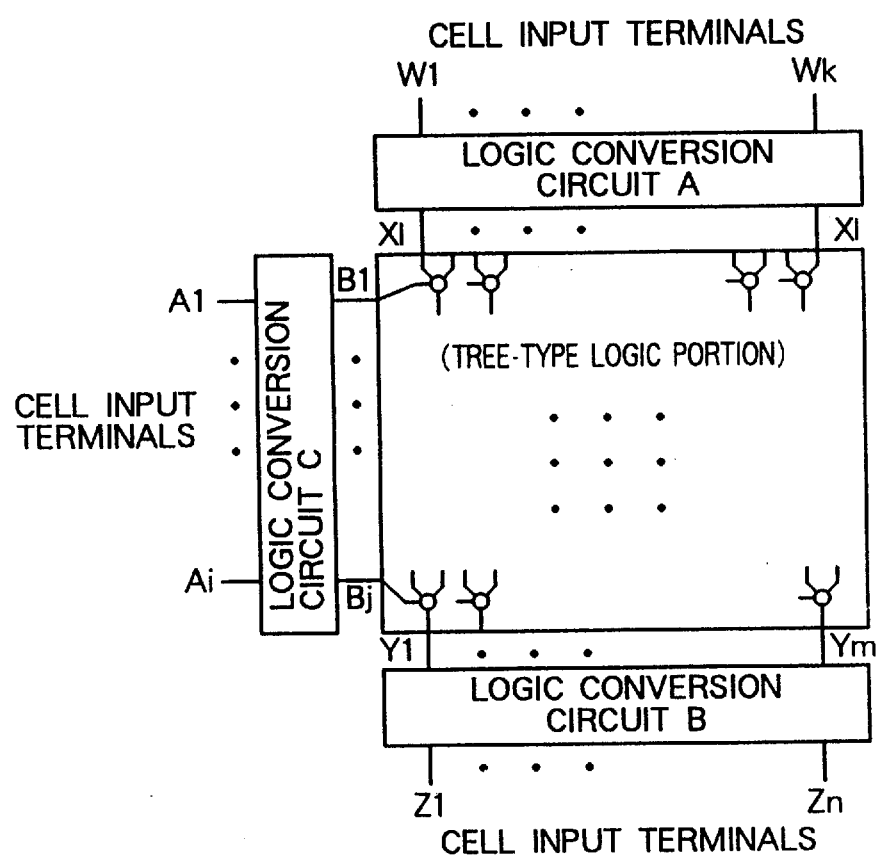
FIGS. 7A and 7B are views each showing an integrated circuit using a cell having a tree type logic portion according to the embodiment of the present invention.
Figure 7B:
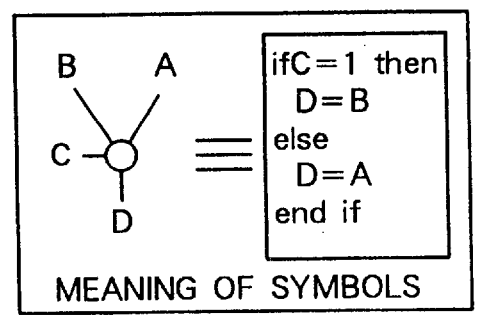

Though the explanation given above is primarily directed to the cell PC3 shown in FIG. 1 by way of example, the internal circuits of the cell capable of executing the same operation are those shown in FIGS. 7 and 8. FIG. 7 shows the structure of the cell used in the present invention. In the drawing, the tree type logic portion is the one which constitutes the logic as the essential point of this cell. Symbol like "Y" represents a circuit which couples at least two active devices and selects one of the two inputs (see FIG. 7). Though the cell input can be directly connected to the tree type logic portion, it may be inputted through a conversion circuit such as a logic conversion circuit A or a logic conversion circuit C. The output of the tree type logic portion is outputted to the output terminal either through a logic conversion circuit B or directly. However, either one of the logic conversion circuits preferably has an amplification circuit so as to isolate the input/output signals and to amplify them.

Figure 8A:
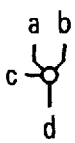
FIGS. 8A and 8B are views each showing the construction of a cell having a tree type logic portion according to the embodiment of the present invention.

A large number of variations may be made for the construction of the tree type logic portion shown in FIG. 8. First, the function for selecting one of the bifurcate branches represented by "Y"-like symbol can be constituted by nMOSs in the same way as PC3 (FIG. 1). In FIG. 8A, this is represented by "n/n" type. In this case, complementary signals such as c and cN are necessary as the signals for controlling the gate. In the n/n-input type shown in FIG. 8A, an inverter is disposed inside the cell and an external control signal is made only one. This provides the advantage that the wirings outside the cell can be reduced. In the next n/p type, one of the nMOSs of the n/n type is changed to a pMOS, and one of the two signal lines can be selected by merely inputting the same signal to the gate. Wiring inside the cell can also be simplified. In this circuit, however, since the amplitude of the signal outputted to the output terminal d becomes as small as Vcc -$V_{TN}$-$V_{TP}$ (where $V_{TN}$ is a threshold voltage of the nMOS and $V_{TP}$ is a threshold voltage of the pMOS), the operation speed is low. The p/p type is obtained by changing the nMOS of the n/n type to a pMOS. The C type is formed by connecting the nMOS and the pMOS in parallel with each other so that the output reaches the full power supply voltage. Though this arrangement provides the advantage that the circuit can operate at a high speed even at a low voltage, there remains the problem that the number of devices is great.

Figure 8B:
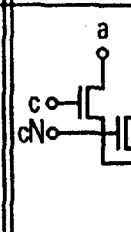

A large number of variations such as those shown in FIG. 8B may be conceivable as the form of the tree of the logic portion. A plurality of cells selected from among them are registered to the cell library and to constitute the same. Among them, the 2-1 tree is necessary for constituting a 2-input logic circuit. The 4-1 tree-b can accomplish all the logic circuits of below 3-input. In this sense, the 2-1 tree and the 4-1 tree-b are basic trees, and they are preferably contained in the cell library. In the 4-1 tree-b, the control signals of the two "Y"-like symbols can be independently controlled. In contrast, in PC4 shown in FIG. 1, they are driven by the common control line and this makes the difference. Though the 4-1 tree-b can constitute a greater number of logic functions, a greater area is necessary for wirings outside the cell because the number of input terminals is great.

The 6-2 tree shown in FIG. 8B is formed by coupling two PC3 shown in FIG. 1, and provides the advantage that wirings outside the cell can be reduced.

Figure 9:
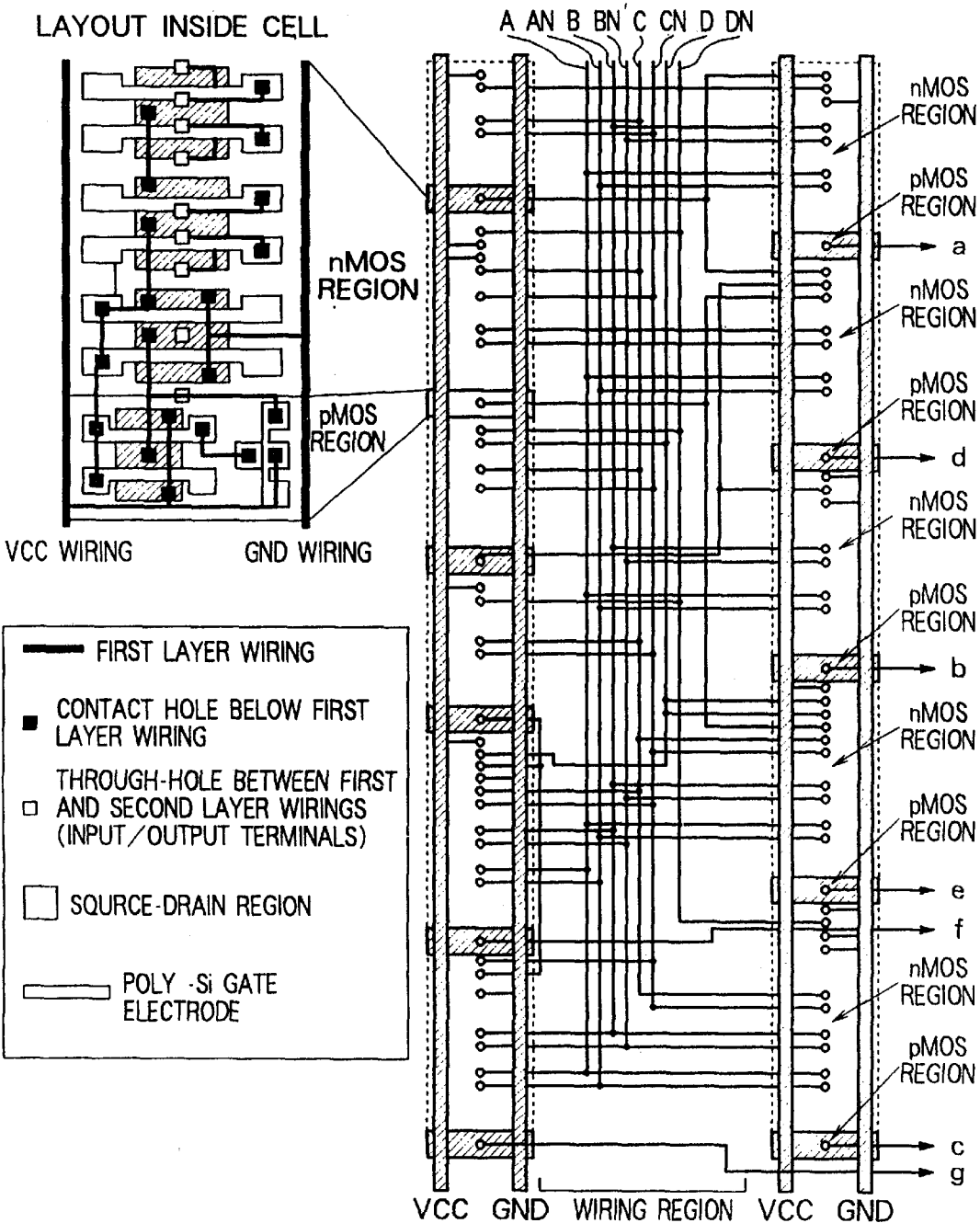
FIG. 9 is a view showing an example where the cells according to the present invention are disposed and wired as standard cells.

When a semiconductor integrated circuit is designed by using the cells shown in FIGS. 1, 7 and 8, the positions of the input/output terminals of the cells are determined and layout of the respective mask pattern is carried out in advance. Then, logic design is made on the pattern. Logic design in this case determines the connection relationship between the cells in order to accomplish the desired logic functions. This can be efficiently made by using the logic formation tool. Next, placement and routing of the cells is carried out on the basis of this connection relationship or the "net list" by a standard cell method. FIG. 9 shows an example where placement and routing of the cells are made on the basis of the present invention. Wiring between the cells is made by aligning the cells in the belt form and disposing a wiring region in parallel with the cells. In this drawing, wiring inside the cells is made by using the first layer wiring alone, wiring in the transverse direction is made by the second layer wiring, and wiring in the longitudinal direction, by the third layer wiring.

Figure 10:
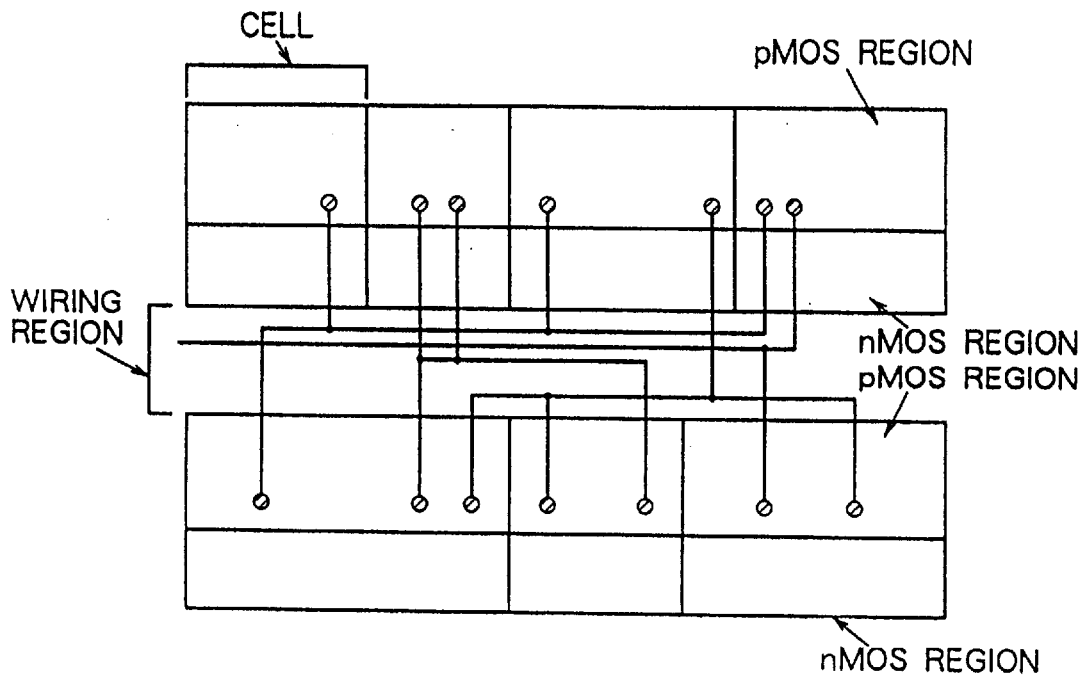
FIG. 10 is a view showing disposition and wiring of conventional CMOS standard cells.
Figure 11:
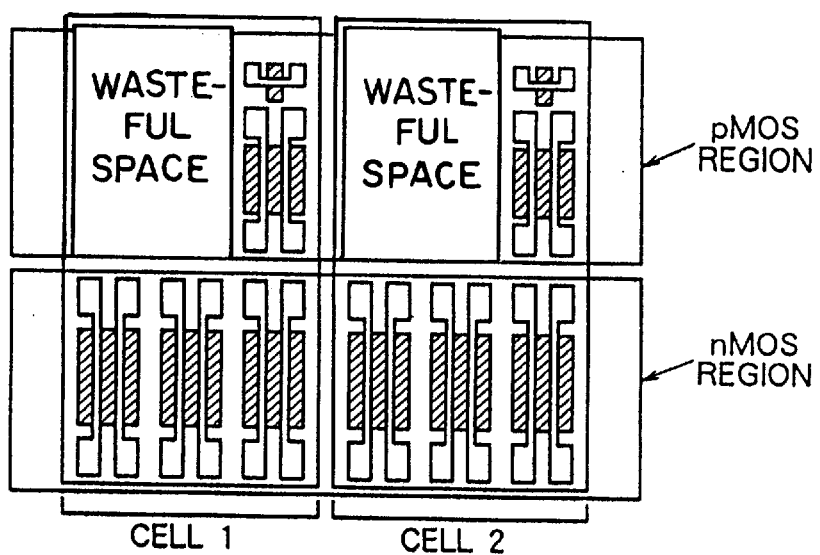
FIG. 11 is a view showing the construction of disposition and wiring when a cell internal circuit of the present invention is disposed in accordance with a conventional disposition and wiring method.

In the integrated circuit using the cells of the embodiment of the present invention, the proportion of the pMOS in the total number of transistors is as low as about ⅙. Accordingly, the inventors of the present invention have found out the new problem that when layout for conventional CMOS is as such used, a great waste occurs in the area. This problem is shown in FIGS. 10 and 11. As shown in FIG. 10, the conventional layout method is based on the premise that the pMOS always form a pair with the nMOS, and it has therefore been customary traditionally to align the rows of the pMOS in parallel with the rows of the nMOS. However, when the cells of the present invention are laid out in accordance with this method as shown in FIG. 11, a wasteful space is unavoidably formed.

To avoid this problem, the embodiment shown in FIG. 9 disposes the cells in the belt-like regions so that the regions of nMOS and the regions of pMOS alternately appear in the belt-like regions. More concretely, the width of layout of each cell is determined to a predetermined size, the nMOS is disposed at the upper part and the pMOS is disposed at the lower part. The number of pMOSs becomes greater in the cell having complicated logic. Therefore, a greater length is secured in the longitudinal direction to cope with this problem. According to this arrangement, the width of the transistor region can be kept substantially constant, and the wiring region, too, becomes substantially constant. Because a wasteful region does not occur, efficiency of the cell area is high unlike the prior art.

In the logic design shown in FIG. 9, the design can be automated by using the logic automatic formation tool. This logic automatic formation tool is an apparatus which automatically generates the net list of the cells using the logic functions as the input data. When the cell library shown in FIG. 1 is assembled into this logic automatic formation tool, performance of the logic circuits so formed can be drastically improved.

The foregoing embodiments represent the case where wiring inside the cell is effected by the first layer wiring and wiring outside the cell is effected by the second and third wirings. Needless to say, the second and third layer wirings may be used for wiring inside the cell in practice. In such a case, the second layer wiring cannot be used as the wiring outside the cell at the portions where it is used as the wiring inside the cell. The first layer wiring can also be used as the inter-cellular wiring, with the proviso that this can be made only at the places where the first layer wiring is not used as the wiring inside the cell.

An example of the gate array integrated circuit according to the present invention will be next explained. The difference of the gate array system from the standard cell system described above resides in that the transistors are regularly disposed in the gate array and the integrated circuit is accomplished by customizing only the wiring layers for each application.

Figure 12:
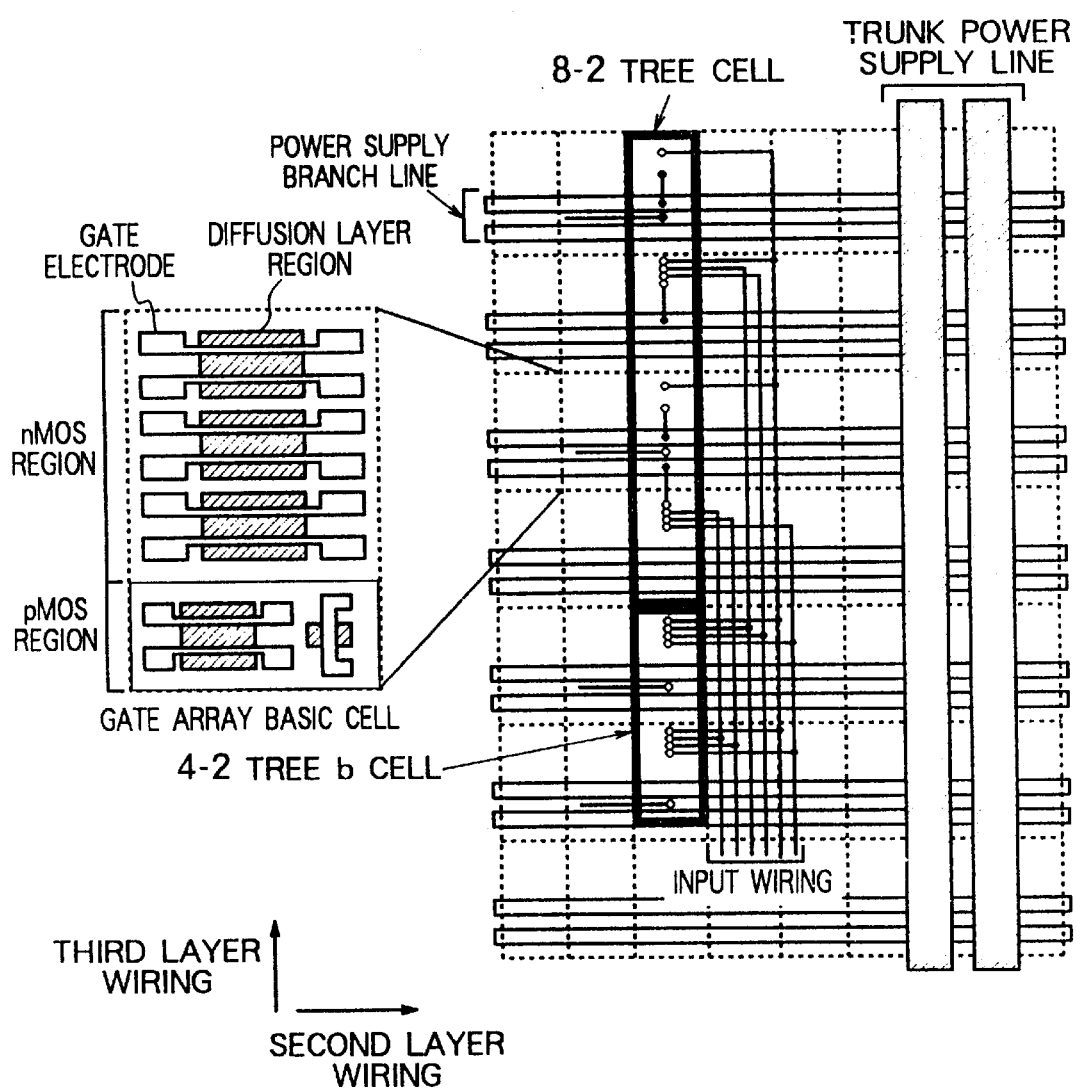
FIG. 12 is a layout diagram when a cell having a tree type logic portion according to the embodiment of the present invention is used as a gate array basic cell.

FIG. 12 shows an embodiment of the gate array integrated circuit according to the present invention. The gate array basic cells shown on the left-hand portion of FIG. 12 are fully spread over the entire surface of the chip. A cell having a more complicated logic function is accomplished by wiring the transistors by using one or a plurality of such basic cells. Here, the term "basic cell" means a repeating unit of the device arrangement that is in advance spread, and does not represent the cell PC3 of the cell library that has so far been explained and is shown in FIG. 1. The cells selected from those shown in FIG. 8 are registered as the cell library. In other words, FIG. 12 shows an example where a full adder is accomplished by connecting the 8-2 tree cell and the 4-2 tree cells (see FIG. 8).

Figure 13:
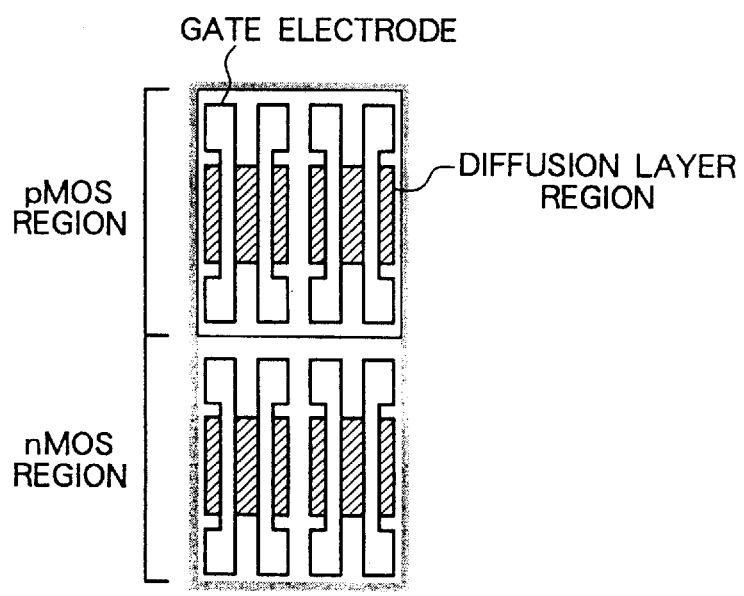
FIG. 13 is a layout diagram of a basic cell of a conventional CMOS gate array.

The basic cell of this embodiment is particularly devised so as to efficiently accomplish the integrated circuit. Because the basic cells are determined in advance in the gate array, the integrated circuit can be accomplished within a short time by merely carrying out the design of the wiring layers and the production. However, because the basic cells are fixed, there is the limit that only the transistors having the predetermined size can be used. On the other hand, as can be clearly understood from FIG. 1, the number of necessary nMOSs is about five times greater than that of pMOSs in the cells PC3, PC4 shown in FIG. 1. Accordingly, when the conventional basic cells shown in FIG. 13 are used, the pMOS portions remain unused. Accordingly, the waste of the area is great. Further, because the pMOS (M25 in FIG. 6B) having a small gate width cannot be accomplished, a greater pMOS must be used instead. For this reason, the problem that discharge of the input terminal shown in FIG. 6B becomes difficult occurs. Consequently, the operation becomes unstable, and the operation speed drops. Furthermore, because the proportion of the pMOSs to the nMOSs of the CMOS inverter cannot be designed to the optimum proportion, the operation speed further drops. The basic cell (the left-hand portion in FIG. 12) of this embodiment is devised on the basis of such an analysis made by the present inventors. This basic cell of the gate array comprises six nMOSs having a large gate width, two pMOSs having a large gate width and one pMOS having a small gate width. When this basic cell is used, the proportion of the nMOSs to the pMOSs in the basic cell substantially coincides with the proportion of the nMOSs to the pMOSs in the cell PC3 shown in FIG. 1. Accordingly, the waste of the area does not occur. Further, because the CMOS inverter of the amplification portion is constituted by using a parallel connection of two nMOSs and a parallel connection of two pMOSs, the optimum gate width (capable of high speed operation) shown in FIG. 6 is determined. Further, because the pMOSs having a small gate width are mounted in advance to the basic cell, the pMOS of M25 in FIG. 6B can be accomplished. Accordingly, the consumed current during latency can be reduced. The conventional basic cell shown in FIG. 13 cannot constitute such a pMOS having a small gate width, so that consumed power during latency becomes great.

Figure 14A:
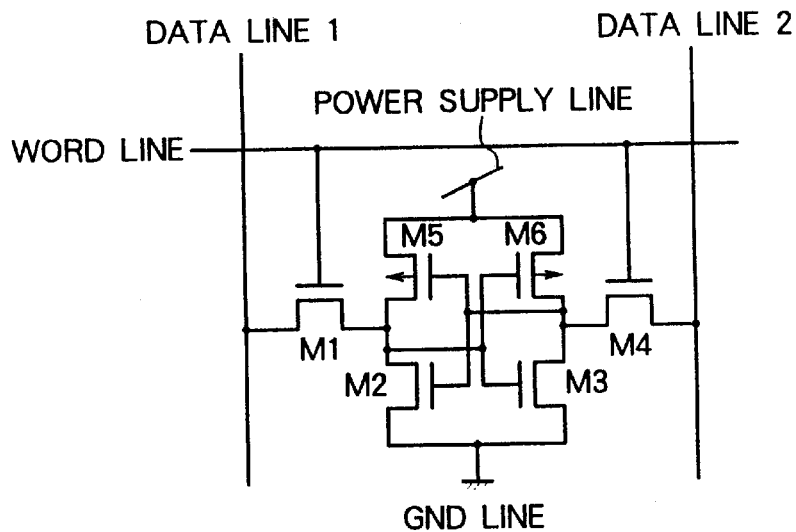
FIGS. 14A and 14B are layout diagrams when an SRAM memory cell is constituted by using the basic cell shown in FIG. 12.
Figure 14B:
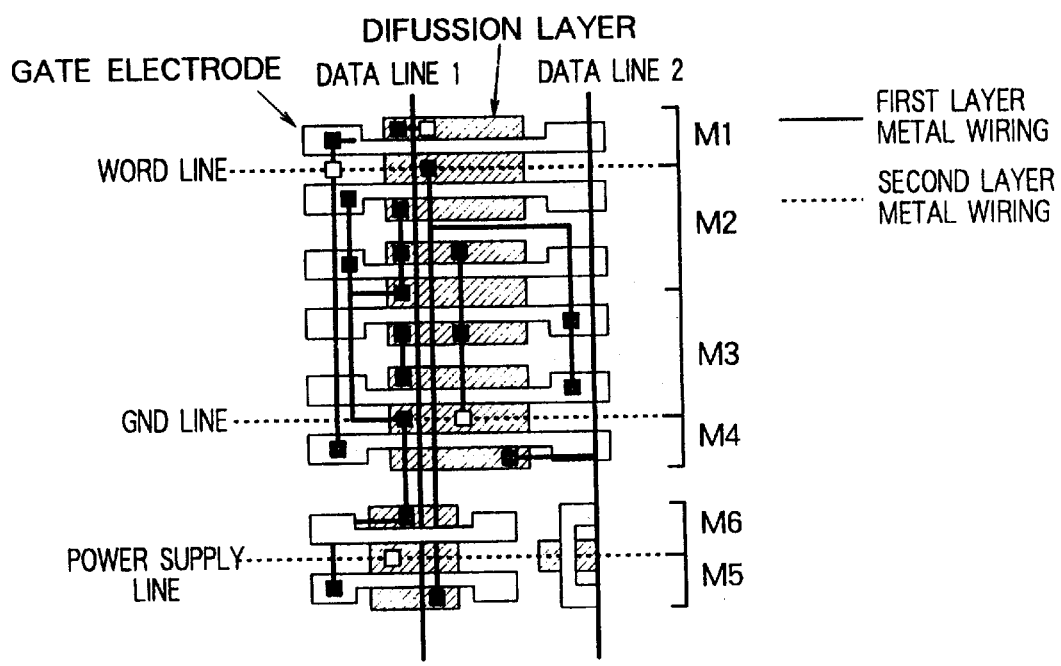

Further, an SRAM memory cell can be accomplished with high area efficiency by using the basic cell shown in FIG. 12. FIG. 14 shows an example where such an SRAM memory cell is accomplished on the basic cell of the present invention. A high performance system LSI having a memory and a logic circuit mounted on the same chip can be accomplished within a short time by accomplishing the high integration SRAM on the gate array. The reason why the basic cell shown in the left-hand portion of FIG. 12 is suitable for mounting the SRAM will be explained next. The circuit shown in FIG. 14 is used most widely as the SRAM memory cell. Obviously, the circuit comprises four nMOSs and two pMOSs. It is ordinary that the nMOSs (M2, M3) as the driving transistors for memory retention are so designed as to have a gate width about twice that of transfer transistor nMOSs (M1, M4). This is to prevent erasure of the stored data at the time of read-out. Since one driving transistor practically comprises a parallel connection of two nMOSs, six nMOSs and two pMOSs are substantially necessary. This is in good agreement with the construction of the basic cell shown in FIG. 23 (six nMOSs, two large pMOSs, one small pMOS; small pMOS is not used for SRAM), and one basic cell can efficiently accomplish the SRAM memory cell for one bit as shown in FIG. 14. In contrast, when the conventional gate array basic cells for CMOS are used, a greater area of at least twice is necessary. In other words, when comparison is made in terms of the same area, an SRAM having a memory capacity of at least twice can be accomplished by using the basic cell shown in FIG. 12. Accordingly, it becomes possible to accomplish an LSI wherein an SRAM having a large capacity and a high performance and compact logical circuit are integrated on the same chip.

Figure 15:
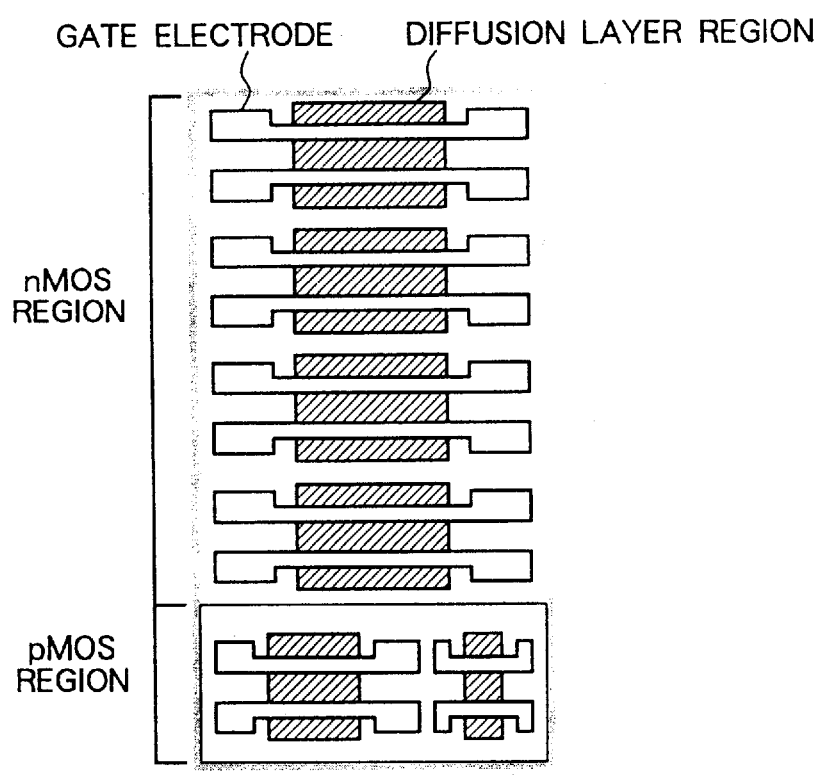
FIG. 15 is a view showing the construction of other gate array basic cell according to the embodiment of the present invention.
Figure 16A:
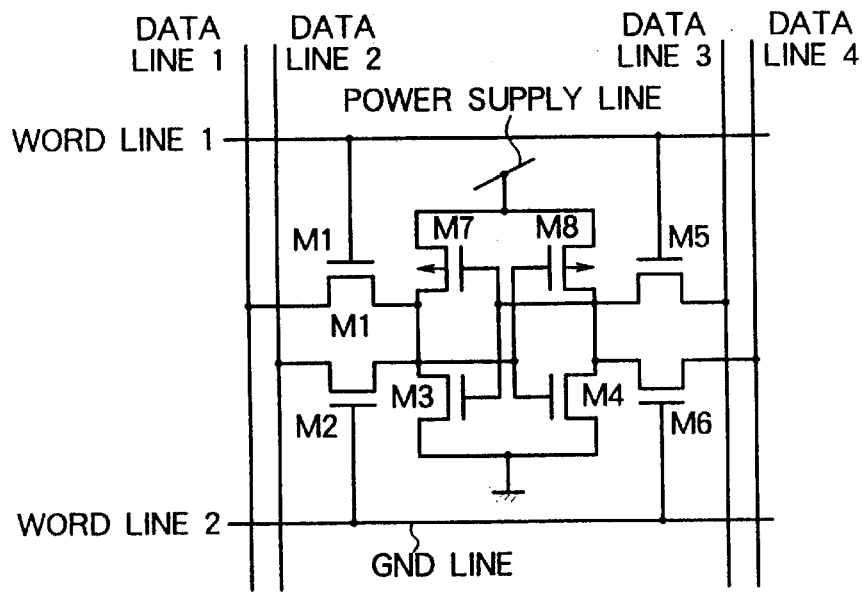
FIGS. 16A and 16B are layout diagrams when a 2-port SRAM memory cell is constituted by using the basic cell shown in FIG. 15.
Figure 16B:
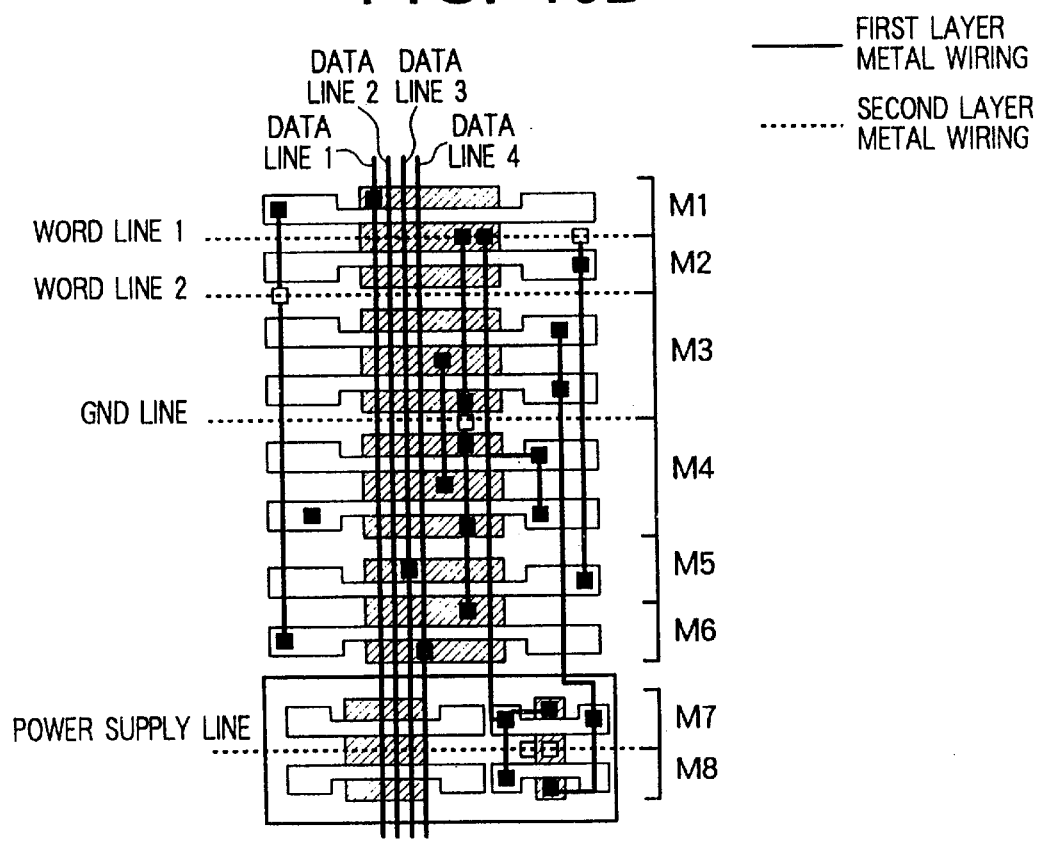

Besides FIG. 12, the basic cell shown in FIG. 15 may be conceivable as the gate array basic cell suitable for the design method of the digital circuit according to this embodiment. The structure shown in FIG. 15 is substantially equal to that of FIG. 12, and the differences lie in that the number of nMOSs becomes greater by two and two small pMOSs are mounted. A 2-port RAM memory cell can be accomplished by using only one of this basic cell. Such a memory cell is shown in FIG. 16.

Another example of the gate array basic cell is shown in FIG. 17. The characteristic feature of this basic cell resides in that the flowing directions of the drain current of the nMOS for logic and the n- and p-MOSs for the inverter are turned by 90°. Because the gates of the n- and p-MOSs for the inverter are disposed close to each other, the CMOS inverter can be easily constituted. Another characteristics feature of this basic cell is that the gates of the two nMOSs functioning as the logic tree are connected in advance by the gate electrodes. Accordingly, this embodiment has the characteristic feature that a cell having two trees forming a pair such as the 8-2 tree shown in FIG. 8B can be efficiently laid out. FIG. 18 shows an example where a 6-2 tree (FIG. 8B) is laid out on one basic cell. Further, a cell which can take out two output terminals from the same tree, such as the 6-4 tree shown in FIG. 8B, can be accomplished by one basic cell, so that area efficiency is also high. Since this cell, too, contains the large nMOS, the small nMOS and the small pMOS, the SRAM memory cell can be efficiently constituted, and a memory cell for two bits can be accomplished by one basic cell.

Next, an embodiment wherein a multiplier for effecting multiplication of 8 bits by 8 bits by using the cell library shown in FIG. 1 or 8 will be explained. FIG. 19 shows a full connection diagram of the multiplier according to this embodiment. The construction is of a carrier-save-adder system which has been known in the past. In this multiplier, all the signal lines are complementarily constituted (that is, signals are transmitted by a pair of a given signal and an inverted signal of the former). Because the inverted signal is inputted to the gate terminals of the nMOS pair constituting the tree, a higher circuit operation can be obtained by generating this inverted signal without using an inverter circuit. Even, when these two inverted signals are generated, the circuit scale does not become double. For, there are those portions which can be used in common between the circuits for generating the signal and for generating the inverted signal, respectively (refer to the 4-2 tree b).

In this multiplier, it is the full adder with partial product generator (PFA) and a two-bit adder (ADD) shown in FIG. 21 that are used widely. In the full adder with the partial product generator, the logic function is accomplished by using two each 4-1 trees c and 4-2 trees c. This logic function is shown at the lower part of FIG. 20. The full adder with the partial product generator executes at a high speed the generation of the partial products of the multiplier and one-bit addition. The two-bit adder shown in FIG. 21 constitute a two-bit adder by using the 4-2 tree d, the 4-2 tree b and the 6-4 tree. This adder is so designed as to particularly reduce the time in which a carry signal to a high order bit is generated after a carry signal c from a lower order bit and its inverted signal CN are inputted.

This embodiment uses the cells for outputting the complementary signals (PFA and ADD described above). Here, the circuit shown in FIG. 22 can be used in place of the output circuit shown in FIG. 6. Symbols X and XN denote the input signals to this output circuit. Let's consider the case where X changes from a low level to a high level and XN changes from high to low, for example. Since X is driven by the pass transistor of nMOS of the preceding stage, the potential can be raised only to $Vcc-V_T$. Since XN falls to the low level at this time, M35 is turned ON. As a result, the potential of X rises to Vcc. Accordingly, a steady current hardly flows through the inverter of M31 and M32. Since this circuit uses the complementary signals, the feedback signal need not be taken out from the output terminal, and the pMOSs (M35, M36) are turned ON at an early timing. For this reason, the high speed operation can be made even at a low voltage.

FIG. 23 shows an example of the construction of a microprocessor using the cell of the embodiment shown in FIG. 1. The instruction fetched by an instruction fetch unit from the main memory by the access by the address is decoded by the instruction decoder, and the instruction is executed as the ALU, the general register and the multiplier are controlled by the control signals in accordance with the decoding results. Particularly, the cell shown in FIG. 1 can be applied similarly to the random logic such as the instruction decoder and to the data pass such as the ALU, etc. The microprocessor can be made compact by using the cell shown in FIG. 1 and the high speed operation becomes possible. Accordingly, performance of various apparatuses using this microprocessor can be improved and their size can be greatly reduced.

Next, a method which accomplishes a high performance integrated circuit within a shorter time than the gate array described in the foregoing embodiment will be described. First, the cells PC3 (or PC4) shown in FIG. 1 are fully spread in advance in the array form. Then, the net list of the cells PC3 is decided in accordance with an intended application, and the wirings of the second and third layers are produced to obtain the intended integrated circuit. According to this method, the integrated circuit can be accomplished by merely effecting wirings of the second and third layers after the logic design (decision of the net list and decision of the intercellular wirings). To fabricate a similar integrated circuit by using the conventional gate array, wirings of the first, second and third layers must be carried out. According to the present invention, however, wiring of only two layers is necessary and for this reason, the integrated circuit can be accomplished within a shorter time. The reason why such an integrated circuit can be accomplished is because the cell PC3 (or PC4) has extremely multiple functions as shown in FIG. 2 and sufficient logic functions can be accomplished by one kind of the cell.

According to the present invention, an integrated circuit having a high operation speed and a high integration density can be accomplished within a short time. The number of transistors of the logic circuit can be reduced to about ½ of that of the conventional CMOS circuit. Accordingly, the area of the integrated circuit can be made smaller than in the prior art circuits, and power consumption can be reduced, too. Further, a greater number of circuits can be integrated in the same area. Accordingly, a greater number of functions can be accomplished, and a higher operation speed can be accomplished by utilizing parallel processing. In the integrated circuit according to the present invention, the number of stages of critical path circuits can be reduced and consequently, a higher operation becomes possible. Since the delay time per circuit is small, the high speed operation becomes possible. A high density high speed digital integrated circuit can be accomplished by using the present invention. Particularly when the present invention is applied to the ASIC, compact and high speed gate arrays, standard cell ICs, cell based ICs, etc., can be accomplished. Microprocessors, microcontrollers, signal processing LSIs, memories, etc., having high performance can also be accomplished. When the present invention is employed, the logic circuit and the SRAM can be efficiently mounted on the gate array, so that a high performance system LSI can be accomplished within a shorter development period. Since the number of cells may be small in the cell library according to the present invention, the time necessary for preparing the cell library can be much more reduced than in the prior art. Accordingly, the latest etching technologies can be applied to the gate arrays and the standard cell integrated circuits, and the present invention is suitable for improving their integration density and the operation speed, so that performance of the integrated circuits and a system using them can be drastically improved. For these reasons, the present invention has an extremely high industrial value.

What is claimed is:

1. A semiconductor integrated circuit device including a plurality of cells, at least one of said cells comprising first, second, third and fourth active devices, first and second nodes, first, second, third, fourth, fifth, sixth and seventh input terminals, and an output terminal, wherein:
    said first active device has a first gate coupled to said first input terminal;
    said second active device has a second gate coupled to said second input terminal;
    said third active device has a third gate coupled to said third input terminal;
    said fourth active device has a fourth gate coupled to said fourth input terminal;
    said first active device has a first source-drain path coupled between said second node and said seventh input terminal;
    said second active device has a second source-drain path coupled between said second node and said sixth input terminal;
    said third active device has a third source-drain path coupled between said first node and said second node;
    said fourth active device has a fourth source-drain path coupled between said first node and said fifth input terminal;
    said first node is coupled to said output terminal;
    said cell has a first diffusion layer region and a second diffusion layer region;
    first and second electrodes traverse said first diffusion layer region to define a first area of said first diffusion layer region sandwiched by said first and second electrodes, and second and third areas of said first diffusion layer region not sandwiched by said first and second electrodes;
    third and fourth electrodes traverse said second diffusion layer region to define a fourth area of said second diffusion layer region sandwiched by said third and fourth electrodes, and fifth and sixth areas of said second diffusion layer region not sandwiched by said third and fourth electrodes;
    said first node is coupled to said first area;
    said second node is coupled to said second and fourth areas;
    said first input terminal is coupled to said fourth electrode;
    said second input terminal is coupled to said third electrode;
    said third input terminal is coupled to said second electrode;
    said fourth input terminal is coupled to said first electrode;
    said fifth input terminal is coupled to said third area;
    said sixth input terminal is coupled to said fifth area; and,
    said seventh input terminal is coupled to said sixth area.

2. The semiconductor integrated circuit device according to claim 1, wherein said first and second diffusion layer regions are disposed between a first power supply wiring conductor for supplying a first electric potential and a second power supply wiring conductor for supplying a second electric potential.

3. The semiconductor integrated circuit device according to claim 2, wherein said first and second power supply wiring conductors are substantially parallel to each other, and said first to sixth areas are juxtaposed in a direction of extension of said first and second power supply wiring conductors.

4. The semiconductor integrated circuit device according to claim 3, wherein said first to seventh input terminals are aligned between said first or second power supply wiring conductor and said first and second diffusion layer regions.

5. A semiconductor integrated circuit device including a plurality of cells, at least one of said cells comprising first, second, third and fourth active devices, first and second nodes, first, second, third, fourth, fifth, sixth and seventh input terminals, and an output terminal, wherein:
    said first active device has a first gate coupled to said first input terminal for receiving a first signal;
    said second active device has a second gate coupled to said second input terminal for receiving a second signal having an opposite phase to the first signal;
    said third active device has a third gate coupled to said third input terminal;
    said fourth active device has a fourth gate coupled to said fourth input terminal;
    said first active device has a first source-drain path coupled between said second node and said seventh input terminal;
    said second active device has a second source-drain path coupled between said second node and said sixth input terminal;
    said third active device has a third source-drain path coupled between said first node and said second node;
    said fourth active device has a fourth source-drain path coupled between said first node and said fifth input terminal;

said first node is coupled to said output terminal;

said cell has a first diffusion layer region and a second diffusion layer region;

first and second electrodes traverse said first diffusion layer region to define a first area of said first diffusion layer region sandwiched by said first and second electrodes, and second and third areas of said first diffusion layer region not sandwiched by said first and second electrodes;

third and fourth electrodes traverse said second diffusion layer region to define a fourth area of said second diffusion layer region sandwiched by said third and fourth electrodes, and fifth and sixth areas of said second diffusion layer region not sandwiched by said third and fourth electrodes;

said first node is coupled to said first area;

said second node is coupled to said second and fourth areas;

said first input terminal is coupled to said fourth electrode;

said second input terminal is coupled to said third electrode;

said third input terminal is coupled to said second electrode;

said fourth input terminal is coupled to said first electrode;

said fifth input terminal is coupled to said third area;

said sixth input terminal is coupled to said fifth area; and, said seventh input terminal is coupled to said sixth area.

6. The semiconductor integrated circuit device according to claim 5, wherein said first and second diffusion layer regions are disposed between a first power supply wiring conductor for supplying a first electric potential and a second power supply wiring conductor for supplying a second electric potential.

7. The semiconductor integrated circuit device according to claim 6, wherein said first and second power supply wiring conductors are substantially parallel to each other, and said first to sixth areas are juxtaposed in a direction of extension of said first and second power supply wiring conductors.

8. The semiconductor integrated circuit device according to claim 7, wherein said first to seventh input terminals are aligned between said first or second power supply wiring conductor and said first and second diffusion layer regions.

9. A semiconductor integrated circuit device including a plurality of cells, at least one of said cells comprising first, second, third and fourth active devices, first and second nodes, first, second, third, fourth, fifth, sixth and seventh points, and an output terminal, wherein:

said first active device has a first gate coupled to said first point for receiving a first signal;

said second active device has a second gate coupled to said second point for receiving a second signal having an opposite phase to the first signal;

said third active device has a third gate coupled to said third point;

said fourth active device has a fourth gate coupled to said fourth point;

said first active device has a first source-drain path coupled between said second node and said seventh point;

said second active device has a second source-drain path coupled between said second node and said sixth point;

said third active device has a third source-drain path coupled between said first node and said second node;

said fourth active device has a fourth source-drain path coupled between said first node and said fifth point;

said first node is coupled to said output terminal;

said cell has a first diffusion layer region and a second diffusion layer region;

first and second electrodes traverse said first diffusion layer region to define a first area of said first diffusion layer region sandwiched by said first and second electrodes, and second and third areas of said first diffusion layer region not sandwiched by said first and second electrodes;

third and fourth electrodes traverse said second diffusion layer region to define a fourth area of said second diffusion layer region sandwiched by said third and fourth electrodes, and fifth and sixth areas of said second diffusion layer region not sandwiched by said third and fourth electrodes;

said first node is coupled to said first area;

said second node is coupled to said second and fourth areas;

said first point is coupled to said fourth electrode;

said second point is coupled to said third electrode;

said third point is coupled to said second electrode;

said fourth point is coupled to said first electrode;

said fifth point is coupled to said third area;

said sixth point is coupled to said fifth area; and said seventh point is coupled to said sixth area; and at least a part of said first and second diffusion layer regions are disposed between a first power supply wiring conductor for supplying a first electric potential and a second power supply wiring conductor for supplying a second electric potential.

* * * * *